(12) United States Patent  
Tsuzuki et al.

(10) Patent No.: US 7,719,382 B2  
(45) Date of Patent: May 18, 2010

(54) LOW-LOSS TUNABLE RADIO FREQUENCY FILTER

(75) Inventors: Genichi Tsuzuki, Ventura, CA (US); Balam A. Willemsen, Newbury Park, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 134 days.

(21) Appl. No.: 11/561,333

(22) Filed: Nov. 17, 2006

(65) Prior Publication Data

US 2007/0247261 A1 Oct. 25, 2007

Related U.S. Application Data

(60) Provisional application No. 60/737,878, filed on Nov. 18, 2005.

(51) Int. Cl.
*H01P 1/20* (2006.01)
(52) U.S. Cl. ...................... 333/99 S; 333/205
(58) Field of Classification Search ............... 333/99 S, 333/205, 202, 174
See application file for complete search history.

(56) References Cited

U.S. PATENT DOCUMENTS

| | | | |
|---|---|---|---|
| 5,410,284 | A | 4/1995 | Jachowski |
| 5,543,758 | A | 8/1996 | Wey |
| 5,616,539 | A | 4/1997 | Hey-Shipton et al. |
| 6,633,208 | B2 | 10/2003 | Salkola et al. |
| 6,662,026 | B1 | 12/2003 | Cordray et al. |
| 6,662,029 | B2 | 12/2003 | Eden et al. |
| 6,791,430 | B2 | 9/2004 | Borzenets et al. |
| 6,933,748 | B2 | 8/2005 | Hey-Shipton |
| 7,482,890 | B2 | 1/2009 | Tsuzuki et al. |

(Continued)

FOREIGN PATENT DOCUMENTS

WO WO 2007073524 A2 6/2007

(Continued)

OTHER PUBLICATIONS

PCT International Search Report for PCT/US2006/61059, Applicant: Superconductor Technologies, Inc., Forms PCT/ISA/210 and PCT/USA/220, dated Apr. 30, 2008 (4 pages).

(Continued)

*Primary Examiner*—Daniel D Chang
(74) *Attorney, Agent, or Firm*—Vista IP Law Group LLP

(57) ABSTRACT

A tunable radio frequency (RF) filter is provided. The RF filter comprises a signal transmission path having an input and an output, a plurality of resonant elements disposed along the signal transmission path between the input and the output, and a plurality of non-resonant elements coupling the resonant elements together. The resonant elements are coupled together to form a stop band having a plurality of transmission zeroes corresponding to respective frequencies of the resonant elements, and at least one sub-band between the transmission zeroes. The non-resonant elements comprise at least one variable non-resonant element for selectively introducing at least one reflection zero within the stop band to create a pass band in one of the sub-bands(s). The variable non-resonant element(s) may be configured for displacing the reflection zero(es) along the stop band to selectively move the pass band within the one sub-band or within selected ones of the sub-bands.

46 Claims, 44 Drawing Sheets

U.S. PATENT DOCUMENTS

| | | | |
|---|---|---|---|
| 2003/0125214 A1* | 7/2003 | Eden et al. | 505/210 |
| 2003/0206078 A1 | 11/2003 | Hey-Shipton | |
| 2006/0202775 A1 | 9/2006 | Tsuzuki et al. | |
| 2007/0247261 A1 | 10/2007 | Tsuzuki et al. | |

FOREIGN PATENT DOCUMENTS

| | | |
|---|---|---|
| WO | WO 2007073524 A3 | 6/2007 |
| WO | WO 2009003190 A1 | 12/2008 |

OTHER PUBLICATIONS

PCT Written Opinion for PCT/US2006/61059, Applicant: Superconductor Technologies, Inc., Form PCT/ISA/237, dated Apr. 30, 2008 (7 pages).

Liang et al. ' HTS Microstrip filters with multiple symmetric and asymmetric prescribed transmission zeros' In: IEEE Trans. Microwave Theory Tech., Sunnyvale, CA: IEEE, 1999, vol. 4, p. 1551-1554 (4 pages).

G.L. Matthaei, et al., Microwave Filters, Impedance-Matching Networks, and Coupling Structures, Artech House (1980) (13 pages).

S. Amari, Synthesis of Cross-Coupled Resonator Filters Using an Analytical Gradient-Based Optimization Technoque, IEEE Trans. Microwave Theory and Technique, vol. 48, No. 9, pp. 1559-1564, Sep. 2000.

G. L. Hey-Shipton, Efficient Computer Design of Compact Planar Band-Pass Filters Using Electrically Short Multiple Coupled Lines, 1999, IEEE MTT-S Int. Microwave Symp. Dig., Jun. 1999 (4 pages).

G. Tsuzuki, Superconducting Filter for IMT-2000 Band, IEEE Trans. Microwave Theory & Techniques, vol. 48, No. 12, pp. 2519-2525, Dec. 2000.

J.S. Hong, et al., Microstrip Filters for RF/Microwave Applications, John Wiley & Sons, Inc. (241 pages) (2001).

R. Wu, et al., New Cross-Coupled Microstrip Band Reject Filters, Microwave Symposium Digest, 2004 IEEE MTII-S Digest, International vol. 3, 6-11, pp. 1597-1600 Jun. 2004.

PCT International Preliminary Report on Patentability (Chapter I of the Patent Cooperation Treaty) for PCT/ US2006/061059, Applicant: Superconductor Technologies, Inc., Form PCT/IB/326 and 373, dated Apr. 30, 2008 (7 pages).

PCT International Search Report for PCT/US2008/068677, Applicant: Superconductor Technologies, Inc., Form PCT/ ISA/210 and 220, dated Sep. 25, 2008 (4 pages).

PCT Written Opinion of the International Search Authority for PCT/US2008/068677, Applicant: Superconductor Technologies, Inc., Form PCT/ISA/327, dated Sep. 25, 2008(5 pages).

* cited by examiner

|  | Left State | Middle State | Right State |
|---|---|---|---|
| CN1 (pF) | 0.10741 | -0.95373 | -1.35375 |
| CN2 (pF) | -0.12466 | -0.12649 | -0.28463 |
| CN3 (pF) | -0.26838 | -0.14857 | -0.22844 |
| CN4 (pF) | -1.66709 | -1.64408 | -1.96161 |
| CTIO (pF) | 0.39323 | 0.37513 | 0.35787 |
| CT12 (pF) | 0.06538 | 0.05738 | 0.08254 |
| CT23 (pF) | 0.00106 | 0.00100 | 0.00267 |
| CT34 (pF) | 0.06104 | 0.05987 | 0.11099 |
| CJ1 (pF) | 0.55594 | 0.89569 | 1.04450 |
| CJ2 (pF) | 0.06199 | 0.07679 | 0.25056 |
| CJ3 (pF) | 0.18084 | 0.07826 | 0.10286 |
| CJ4 (pF) | 1.06869 | 0.83460 | 0.47171 |
| CR1 (pF) | 7.54817 | 7.20842 | 7.05961 |
| CR2 (pF) | 7.31380 | 7.29900 | 7.12524 |
| CR3 (pF) | 6.53139 | 6.63397 | 6.60937 |
| CR4 (pF) | 5.04031 | 5.27440 | 5.63729 |
| LR (nH) | 5.00000 | 5.00000 | 5.00000 |

FIG. 14

LOW-LOSS TUNABLE RADIO FREQUENCY FILTER

RELATED APPLICATION

This application claims priority from U.S. Provisional Patent Application Ser. No. 60/737,878, filed Nov. 18, 2005, which is expressly incorporated herein by reference.

FIELD OF THE INVENTION

The present inventions generally relate to microwave circuits, and in particular, microwave band-pass filters.

BACKGROUND OF THE INVENTION

Electrical filters have long been used in the processing of electrical signals. In particular, such electrical filters are used to select desired electrical signal frequencies from an input signal by passing the desired signal frequencies, while blocking or attenuating other undesirable electrical signal frequencies. Filters may be classified in some general categories that include low-pass filters, high-pass filters, band-pass filters, and band-stop filters, indicative of the type of frequencies that are selectively passed by the filter. Further, filters can be classified by type, such as Butterworth, Chebyshev, Inverse Chebyshev, and Elliptic, indicative of the type of bandshape frequency response (frequency cutoff characteristics) the filter provides relative to the ideal frequency response.

The type of filter used often depends upon the intended use. In communications applications, band-pass filters are conventionally used in cellular base stations and other telecommunications equipment to filter out or block RF signals in all but one or more predefined bands. For example, such filters are typically used in a receiver front-end to filter out noise and other unwanted signals that would harm components of the receiver in the base station or telecommunications equipment. Placing a sharply defined band-pass filter directly at the receiver antenna input will often eliminate various adverse effects resulting from strong interfering signals at frequencies near the desired signal frequency. Because of the location of the filter at the receiver antenna input, the insertion loss must be very low so as to not degrade the noise figure. In most filter technologies, achieving a low insertion loss requires a corresponding compromise in filter steepness or selectivity.

In commercial telecommunications applications, it is often desirable to filter out the smallest possible pass band using narrow-band filters to enable a fixed frequency spectrum to be divided into the largest possible number of frequency bands, thereby increasing the actual number of users capable of being fit in the fixed spectrum. With the dramatic rise in wireless communications, such filtering should provide high degrees of both selectivity (the ability to distinguish between signals separated by small frequency differences) and sensitivity (the ability to receive weak signals) in an increasingly hostile frequency spectrum. Of most particular importance is the frequency ranges of 800-900 MHz range for analog cellular communications, and 1,800-2,200 MHz range for personal communication services (PCS).

Of particular interest to the present invention is the need for a high-quality factor Q (i.e., measure of the ability to store energy, and thus inversely related to its power dissipation or lossiness), low insertion loss, tunable filter in a wide range of microwave and RF applications, in both military (e.g., RADAR), communications, and electronic intelligence (ELINT), and the commercial fields, such as in various communications applications, including cellular. In many applications, a receiver filter must be tunable to either select a desired frequency or to trap an interfering signal frequency. Thus, the introduction of a linear, tunable, band-pass filter between the receiver antenna and the first non-linear element (typically a low-noise amplifier or mixer) in the receiver, offers substantial advantages in a wide range of RF microwave systems, providing that the insertion loss is very low.

For example, in commercial applications, the 1,800-2,200 MHz frequency range used by PCS can be divided into several narrower frequency bands (A-F bands), only a subset of which can be used by a telecommunications operator in any given area. Thus, it would be beneficial for base stations and hand-held units to be capable of being reconfigured to operate with any selected subset of these frequency bands. As another example, in RADAR systems, high amplitude interfering signals, either from "friendly" nearby sources, or from jammers, can desensitize receivers or intermodulate with high-amplitude clutter signal levels to give false target indications. Thus, in high-density signal environments, RADAR warning systems frequently become completely unusable, in which case, frequency hopping would be useful.

Microwave filters are generally built using two circuit building blocks: a plurality of resonators, which store energy very efficiently at one frequency, $f_0$; and couplings, which couple electromagnetic energy between the resonators to form multiple stages or poles. For example, a four-pole filter may include four resonators. The strength of a given coupling is determined by its reactance (i.e., inductance and/or capacitance). The relative strengths of the couplings determine the filter shape, and the topology of the couplings determines whether the filter performs a band-pass or a band-stop function. The resonant frequency $f_0$ is largely determined by the inductance and capacitance of the respective resonator. For conventional filter designs, the frequency at which the filter is active is determined by the resonant frequencies of the resonators that make up the filter. Each resonator must have very low internal resistance to enable the response of the filter to be sharp and highly selective for the reasons discussed above. This requirement for low resistance tends to drive the size and cost of the resonators for a given technology.

Typically, fixed frequency filters are designed to minimize the number of resonators required to achieve a certain shape as the size and cost of a conventional filter will increase linearly with the number of resonators required to realize it. As is the case for semiconductor devices, photolithographically defined filter structures (such as those in high-temperature superconductor (HTS), micro electromechanical systems (MEMS), and film bulk acoustic resonator (FBAR) filters are much less sensitive to this kind of size and cost scaling than conventional combline or dielectric filters.

The approaches used to design tunable filters today follow the same approach as described above with respect to fixed frequency filters. Thus, they lead to very efficient, effective, and simple circuits; i.e., they lead to the simplest circuit necessary to realize a given filter response. In prior art tuning techniques, all the resonant frequencies of the filter are adjusted to tune the filter's frequency. For example, if it is desired to increase the operating frequency band of the device by 50 MHz, all of the resonant frequencies of the narrow-band filter must be increased by 50 MHz. While this prior art technique has been generally successful in adjusting the frequency band, it inevitably introduces resistance into the resonators, thereby disadvantageously increasing the insertion loss of the filter.

Although HTS filters may be tuned without introducing significant resistance into the resonators by mechanically moving an HTS plate above each resonator in the filter to change its resonant frequency, such technique is inherently slow (on the order of seconds) and requires relative large three-dimensional tuning structures. Insertion loss can be reduced in so-called switched filter designs; however, these designs still introduce a substantial amount of loss between switching times and require additional resonators. For example, the insertion-loss can be reduced, by providing two filters and a pair of single-pole double-throw (SP2T) switches to select between the filters, thus effectively reducing the tuning range requirement, but increasing the number of resonators by a factor of two. The loss can further be reduced by introducing more switches and filters, but each additional filter will require the same number of resonators as the original filter.

There, thus, remains a need to provide a band-pass filter that can be tuned quickly with a decreased insertion loss.

SUMMARY OF THE INVENTION

In accordance with a first aspect of the present inventions, a radio frequency (RF) filter is provided. The RF filter comprises a signal transmission path having an input and an output, a plurality of resonant elements disposed along the signal transmission path between the input and the output, and a plurality of non-resonant elements coupling the resonant elements together. The resonant elements are coupled together to form a stop band having a plurality of transmission zeroes corresponding to respective frequencies of the resonant elements, and at least one sub-band between the transmission zeroes. The non-resonant elements have susceptance values that locate at least one reflection zero within the stop band to create a pass band in one of the at least one sub-bands.

While the non-resonant elements may be fixed in one embodiment, in particular advantageous embodiments, the non-resonant elements comprise at least one variable non-resonant element for selectively introducing at least one reflection zero within the stop band to create a pass band in one of the sub-bands(s). The variable non-resonant element may have, e.g., an adjustable susceptance, and may include one or more of a variable capacitor, a loss-loss switch, a varactor, and a switched capacitor. In one embodiment, each of the resonant elements comprises a thin-film lumped element structure (such as, e.g., a high temperature superconductor (HTS)), although a resonant element can take the form of any structure that resonates at a desired frequency.

In one embodiment, the variable non-resonant element(s) are configured for displacing the reflection zero(es) along the stop band to selectively move the pass band within the one sub-band. If a plurality of sub-bands are between the transmission zeroes, the variable non-resonant element(s) can be for displacing the reflection zero(es) along the stop band to create the pass band within selected ones of the sub-bands. Alternatively, or in addition to, the variable non-resonant element(s) can be for displacing at least another reflection zero within the stop band to create another pass band within another one of the sub-bands. In one embodiment, the pass band has substantially different bandwidths within the selected sub-bands. Although the present inventions should not be so limited in their broadest aspects, the ability to introduce a pass band within a selected one of the sub-bands by adjusting the variable non-resonant element(s), eliminates, or at least minimizes, the need to adjust the frequencies of the resonant elements, thereby decreasing the insertion loss incurred by the filter.

In another embodiment, the RF filter further comprises at least one tuning element configured for modifying the frequency of at least one of the resonant elements. For example, the tuning element(s) can be configured for modifying the frequency of the resonant element(s) to displace each transmission zero of the resonant element(s) along the stop band relative to the reflection zero(es). As another example, the RF filter comprises a plurality of tuning elements configured for modifying the frequencies of the resonant elements to simultaneously displace the stop band with the pass band along a frequency range. In an optional embodiment, the RF filter comprises a controller configured for generating electrical signals to adjust the variable non-resonant element(s).

In accordance with a second aspect of the present inventions, another RF filter is provided. The RF filter comprises a signal transmission path having an input and an output, a plurality of nodes disposed along the signal transmission path, a plurality of resonant branches respectively extending from the nodes, and a plurality of non-resonant branches respectively extending from the nodes. The RF filter further comprises a plurality of resonant elements respectively coupled to the resonant branches, a plurality of non-resonant elements, some of which are respectively coupled to the non-resonant branches, a plurality of transmission zeroes corresponding to resonant frequencies of the resonant elements, and at least one reflection zero formed between the transmission zeroes to create a pass band.

In one embodiment, the non-resonant elements comprise at least one variable non-resonant element for selectively displacing the reflection zero(es) relative to the transmission zeroes. In another embodiment, the plurality of transmission zeroes comprises more than two transmission zeroes. In other embodiments, each of the resonant elements comprises a thin-film lumped element structure (such as, e.g., a high temperature superconductor (HTS)), although a resonant element can take the form of any structure that resonates at a desired frequency.

In accordance with a third aspect of the present inventions, a method of tuning a RF filter having a stop band that defines a tuning range is provided. The method comprises modifying the RF filter from a first frequency configuration to a second frequency configuration. When in the first frequency configuration, the RF filter has a first set of pass band characteristics within the tuning range, and when in the second frequency configuration, the RF filter has a second different set of pass band characteristics within the tuning range of the stop band. By way of non-limiting example, the first and second pass band characteristics having different center frequencies, different bandwidths, and/or different numbers of non-contiguous pass bands. In one method, the RF filter is modified from the first frequency configuration to the second frequency configuration by displacing at least one reflection zero within the stop band. In this case, the stop band has a plurality of transmission zeroes, and the at least one reference zero(es) is displaced in frequency more than the transmission zeroes are displaced in frequency. In this case, the insertion loss of the RF filter is minimized when modifying the RF filter from the first frequency configuration to the second frequency configuration.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 14 is a table illustrating component values used in modeling the RF filter of FIG. 14 for three filter states;

DETAILED DESCRIPTION OF THE EMBODIMENTS

Figure 1:
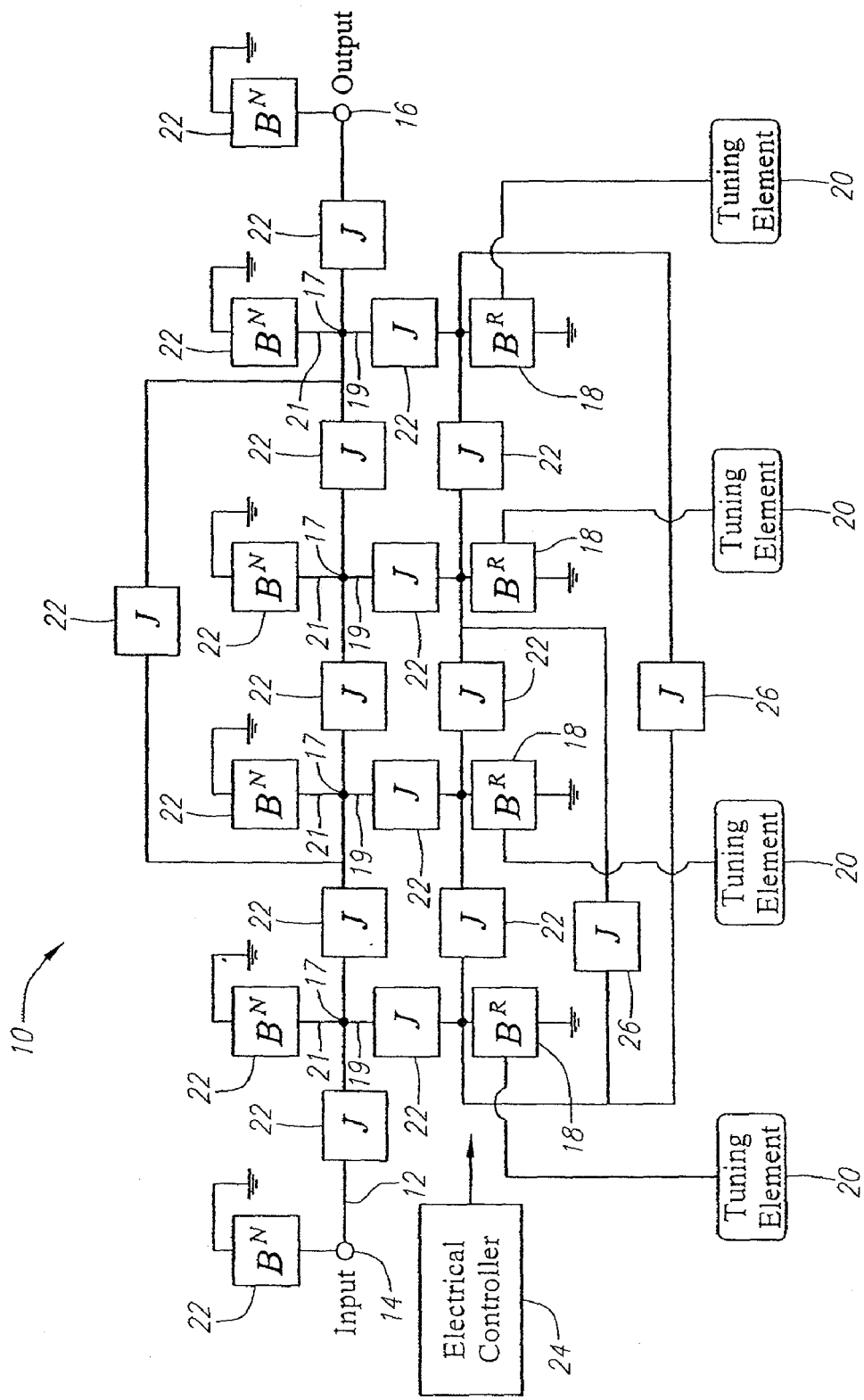
FIG. 1 is a block diagram of a tunable radio frequency (RF) filter constructed in accordance with one embodiment of the present inventions.

Referring to FIG. 1, a tunable radio frequency (RF) filter 10 constructed in accordance with the present inventions will now be described. In the illustrated embodiment, the RF filter 10 is a band-pass filter having pass band tunable within a desired frequency range, e.g., 800-900 MHz or 1,800-2,220 MHz. In a typical scenario, the RF filter 10 is placed within the front-end of a receiver (not shown) behind a wide pass band filter that rejects the energy outside of the desired frequency range. The RF filter 10 generally comprises a signal transmission path 12 having an input 14 and an output 16, a plurality of nodes 17 disposed along the signal transmission path 12, a plurality of resonant branches 19 respectively extending from the nodes 17, and a plurality of non-resonant branches 21 respectively extending from the nodes 17. The RF filter 10 further comprises a plurality of resonant elements 18 (in this case, four) between the input 14 and output 16, and in particular coupled between the resonant branches 21 and ground, a plurality of tuning elements 20 for adjusting the frequencies of the resonant elements 18, a plurality of non-resonant elements 22 coupling the resonant elements 18 together, four of which are coupled between the non-resonant branches 21 and ground. The RF filter 10 further comprises an electrical controller 24 configured for tuning the RF filter 10 to a selected narrow-band within the frequency range.

The signal transmission path 12 may comprise a physical transmission line to which the non-resonant elements 22 are directly or indirectly coupled to, although in alternative embodiments, a physical transmission line is not used. In the illustrated embodiment, the resonant elements 18 includes lumped element electrical components, such as inductors and capacitors, and in particular, thin-film lumped structures, such as planar spiral structures, zig-zag serpentine structures, single coil structures, and double coil structures. Such structures may include thin film epitaxial high temperature superconductors (HTS) that are patterned to form capacitors and inductors on a low loss substrate. Further details discussing high temperature superconductor lumped element filters are set forth in U.S. Pat. No. 5,616,539, which is expressly incorporated herein by reference.

In the illustrated embodiment, the resonant elements 18 are represented by susceptance $B^R$, and the non-resonant elements 22 are represented by susceptance $B^N$, which are coupled in parallel with the resonant elements 18, and admittance inverters J, which are coupled between the resonant elements 18. Selected ones of the non-resonant elements 22 can be varied, while any remaining ones of the non-resonant elements 22 remained fixed.

As will be described in greater detail below, the non-resonant elements 22 may be varied to tune the pass band substantially over the entire frequency range, with the frequencies of the resonant elements 18, if necessary, only slightly adjusted to accommodate and/or move the pass band within a relatively portion of the frequency range. In this manner, the insertion loss of the filter 10 is significantly reduced, since it is the non-resonant elements 22, rather than the resonant elements 18, that are used as the primary means for tuning the filter 10. That is, because adjustment of the non-resonant elements 22 contributes less to the loss of the filter 10 than does the adjustment of the significantly loss sensitive resonant elements 18, the filter 10 will have less loss than prior art filters that utilize resonant elements as the main means for tuning the filter 10. In addition, since the frequencies of the resonant elements 18 are adjusted very little, if at all, the tuning speed of the filter 10 is increased.

The RF filter 10 accomplishes the foregoing by introducing a narrow pass band with selected regions of a wide stop band. That is, although the RF filter 10 is ultimately used as a pass band filter, the resonant elements 18 are actually coupled together by the non-resonant elements 22—not to create a pass band, but rather to create a wide stop band response having transmission zeroes (in this case, numbering four) corresponding to the respective frequencies of the resonant elements 18. The electrical controller 24 then adjusts the non-resonant elements 22 to introduce and displace reflection zeroes along the stop band to move a narrow pass band within the desired frequency range. The electrical controller 24 may also adjust the frequencies of the resonating elements 18 via the tuning elements 20 to move the transmission zeroes along the frequency range to optimize the filter response. In the illustrated embodiment, the electrical controller 24 including memory (not shown) for storing the values of the non-resonant elements 22 necessary to effect the desired location of the pass band within the frequency range.

This technique will now be described with reference to various exemplary filter responses modeled in accordance with the following equations:

$$S_{11}(s) = \frac{F(s)}{E(s)}, S_{21}(s) = \frac{P(s)}{\varepsilon E(s)}, |E|^2 = |F|^2 + \frac{|P|^2}{\varepsilon^2},$$

where $S_{11}$ is the input reflection coefficient of the filter, $S_{21}$ is the forward transmission coefficient, s is the normalized frequency, F and P are N-order polynomial (where N is the number of resonant elements) of the generalized complex frequency s, and $\varepsilon$ is a constant that defines equal ripple return loss. Each of the coefficients $S_{11}$ and $S_{21}$ is capable of having up to an N number of zero-points, since the numerator has an Nth order. When both of the coefficients $S_{11}$, $S_{21}$ have all N zero-points, the filter response is considered fully elliptic. Further details discussing the modeling of filters are set forth in "Microstrip Filters for RF/Microwave Application," Jia-Shen G. Hong and M. J. Lancaster, Wiley-Interscience 2001. The normalized frequency, s=iw can be mapped into real frequency in accordance with the equation:

$$w = \frac{f_c}{BW}\left(\frac{f}{f_c} - \frac{f_c}{f}\right),$$

where f is the real frequency, $f_c$ is the center frequency, and BW is the bandwidth of the filter. Further details discussing the transformation of normalized frequency into real frequency are set forth in "Microwave Filters, Impedance-Matching Networks, and Coupling Structures," G. Matthaei, L. Young and E. M. T. Jones, McGraw-Hill (1964).

Figure 2:
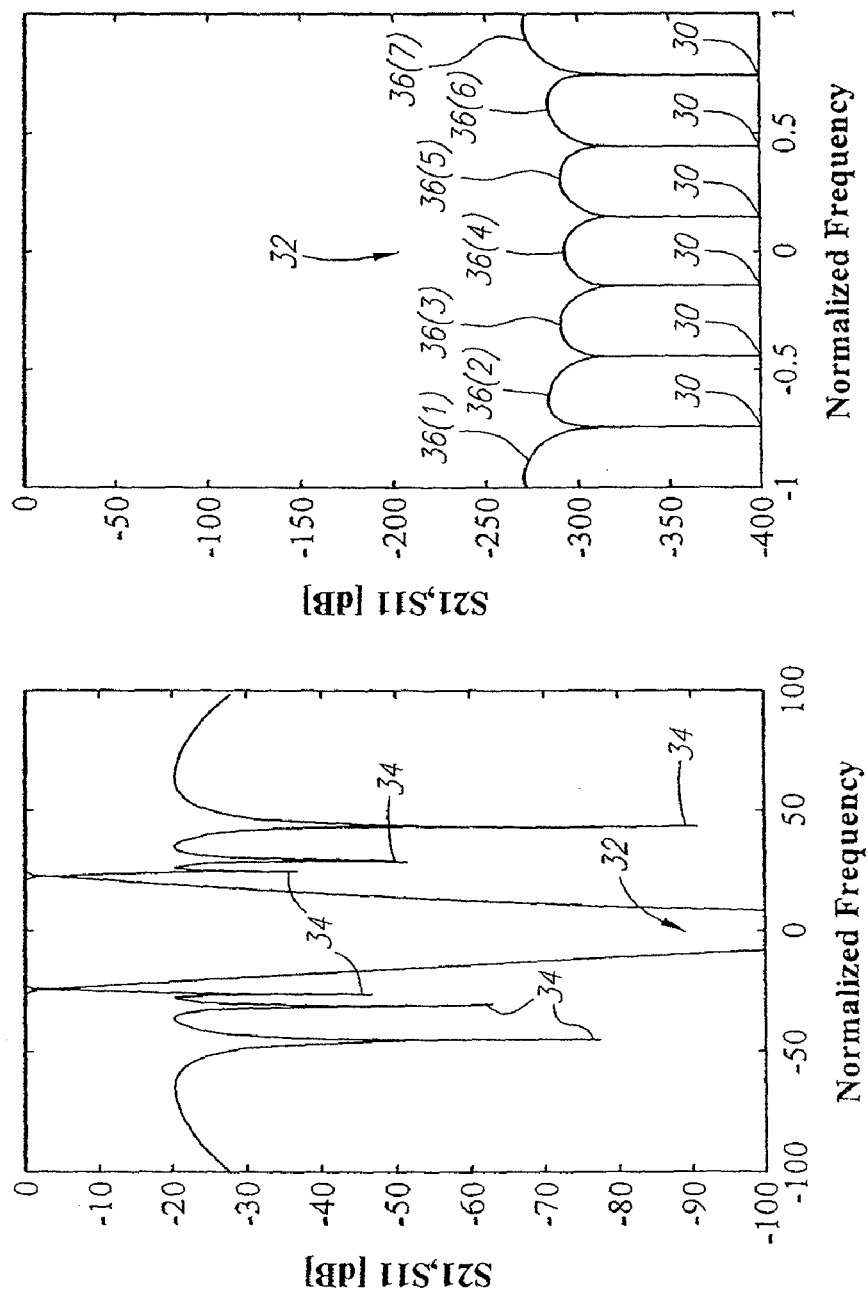
FIG. 2 is a plot of a modeled frequency response of an exemplary wide stop band using eight resonant elements.

FIG. 2 illustrates an exemplary wide band stop filter response, which was modeled using eight resonant elements, thereby creating eight corresponding transmission zeroes 30 (only six shown) at the respective resonant element frequencies (as best shown in the right side view of FIG. 2) to form a stop band 32, and eight reflection zeroes 34 (only six shown) that fall outside of this stop band 32 (as best shown in the left side view of FIG. 2). In this particular example, the transmission zeroes 30 are positioned at −1.05, −0.75, −0.45, −0.15, 0.15, 0.45, 0.75, and 1.05 in the normalized frequency range, thereby creating a stop band having a normalized frequency range between −1.05 and 1.05. As shown in right side view of FIG. 2, the filter response includes seven "bounce-backs" in regions 36 between the transmission zeroes 30 that are respectively located at −0.90, −0.60, −0.30, 0.0, 0.30, 0.60, and 0.90. Thus, in general, a stop band filter includes an N number of transmission zeroes (corresponding to the N number of resonant elements), up to N number of reflection zeroes, and an N−1 number of bounce-back regions 36.

Figure 3:
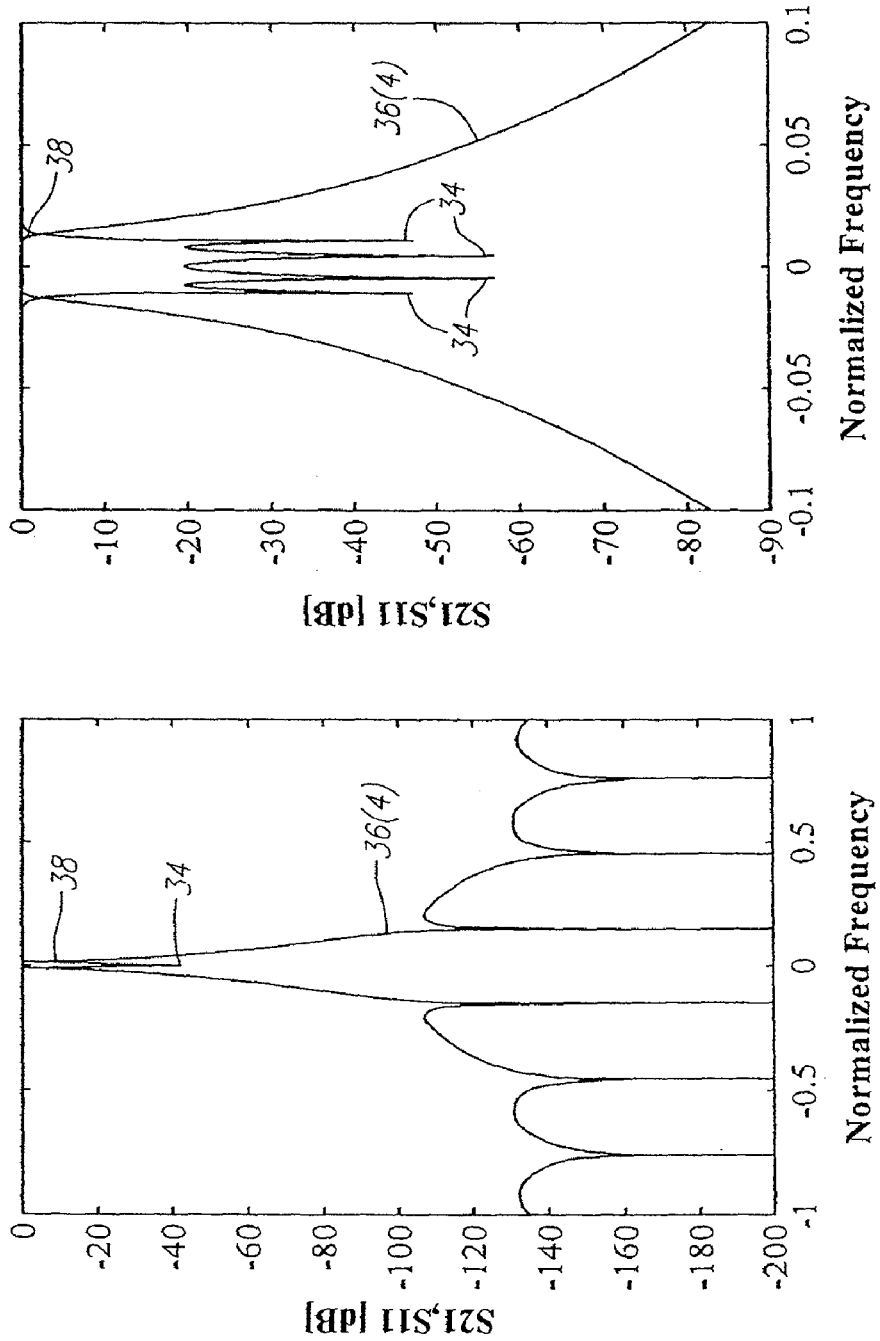
FIG. 3 is a plot of the frequency response of FIG. 2, wherein a pass band has been introduced within a sub-band of the stop band.

Significantly, a pass band can be formed from any one of the bounce-backs in regions 36 illustrated in FIG. 2 (herein after referred to as "sub-bands") by displacing at least one of the reflection zeroes 34 into the stop band 32 (i.e., by adjusting the values of the non-resonant elements). For example, FIG. 3 illustrates an exemplary filter response where four of the reflection zeroes 34 have been introduced into the stop band of FIG. 2 to create a pass band 38 within the center sub-band 36(4) (i.e., at 0). The reflection zeroes 34 can be displaced along the stop band 32 (i.e., by adjusting the values of the non-resonant elements), thereby creating the pass band 38 within selected ones of the sub-bands 36. That is, the reflection zeroes 34 can be displaced along the stop band 32 to "hop" the pass band 38 between sub-bands 36.

For example, FIGS. 4(a)-4(g) illustrate exemplary filter responses where the four reflection zeroes 34 have been displaced within the stop band 32 to selectively create the pass band 38 in the centers of all seven of the sub-bands 36. That is, going sequentially through FIGS. 4(a)-4(g), the pass band 38 hops from the first sub-band 36(1) (FIG. 4(a)), to the second sub-band 36(2) (FIG. 4(b)), to the third sub-band 36(3) (FIG. 4(c)), to the fourth sub-band 36(4) (FIG. 4(d)), to the fifth sub-band 36(5) (FIG. 4(e)), to the sixth sub-band 36(6) (FIG. 4(f)), and then finally to the seventh sub-band 36(7) (FIG. 4(g)). Thus, in the illustrated embodiment, the center of the pass band 38 can hop between −0.90, −0.60, −0.30, 0.0, 0.30, 0.60, and 0.90. It should be noted that while the sequence of FIGS. 4(a)-4(g) implies that the pass band 38 is hopped between adjacent sub-bands 36, the pass band 38 may be hopped between non-adjacent sub-bands 36; for example, from the second sub-band 36(2) to the fifth sub-band 36(5).

While the pass band 38 can be hopped between sub-bands 36 to discretely cover the desired frequency range, the transmission zeroes 30 can be simultaneously moved in concert from their nominal positions (i.e., by adjusting the frequencies of the resonating elements) to displace the entire stop band 32, and thus the pass band 38, within the normalized frequency range. Thus, the pass band 38 can be moved from the centers of the sub-bands 36 (i.e., −0.90, −0.60, −0.30, 0.0, 0.30, 0.60, and 0.90) to cover the continuum of the desired frequency range. Thus, if all of the transmission zeroes 30 can be displaced by +/−0.15 from their nominal positions (i.e., resonant elements tuned together in a frequency range of +/−0.15), each pass band 38 illustrated in FIGS. 4(a)-4(g) would cover 15% of the normalized frequency range from −1.05 to 1.05.

Figure 4A:
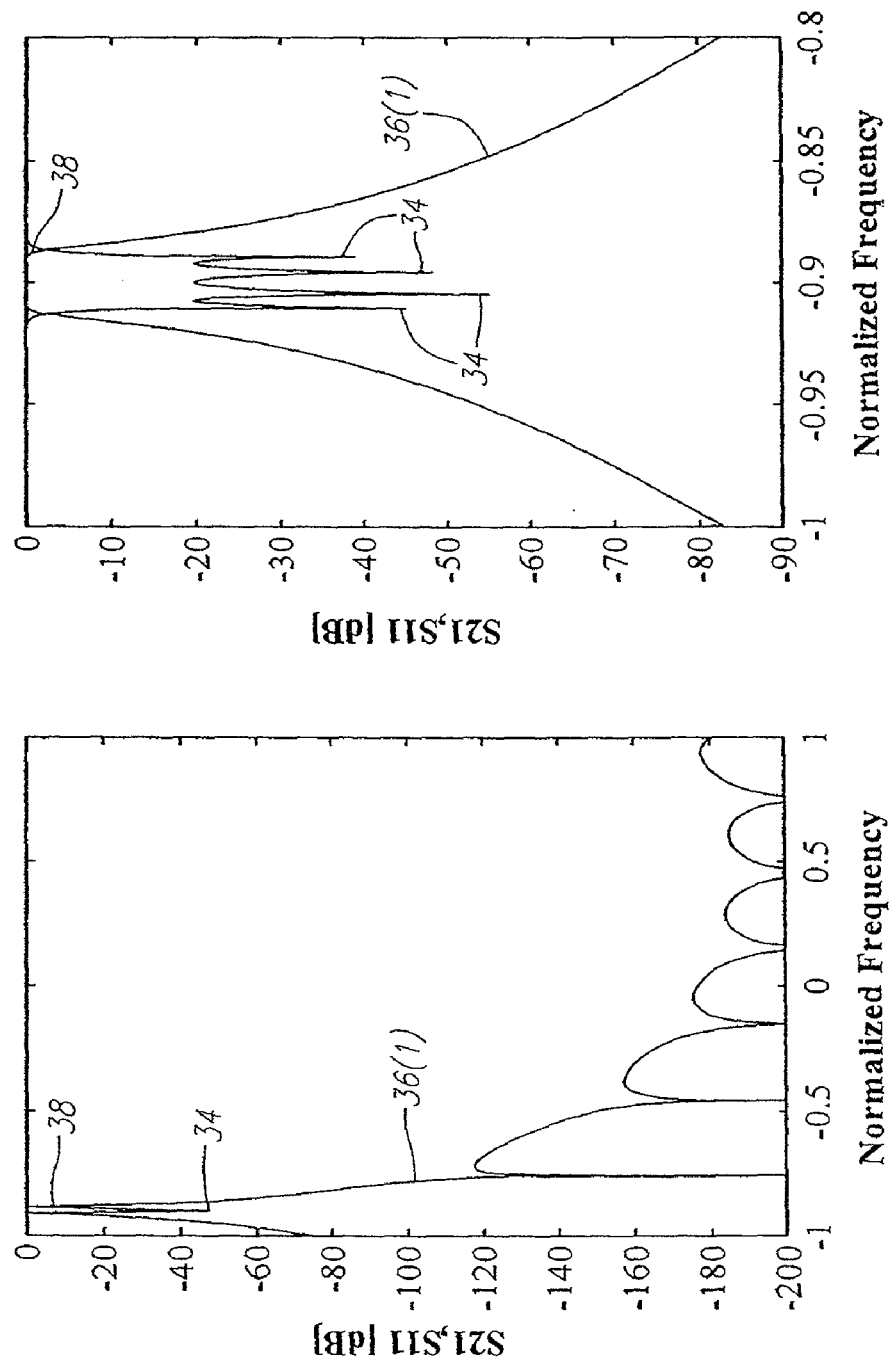
FIGS. 4(a)-4(g) are plots of the frequency response of FIG. 2, wherein a pass band has been introduced within selected sub-bands of the stop band.
Figure 4B:
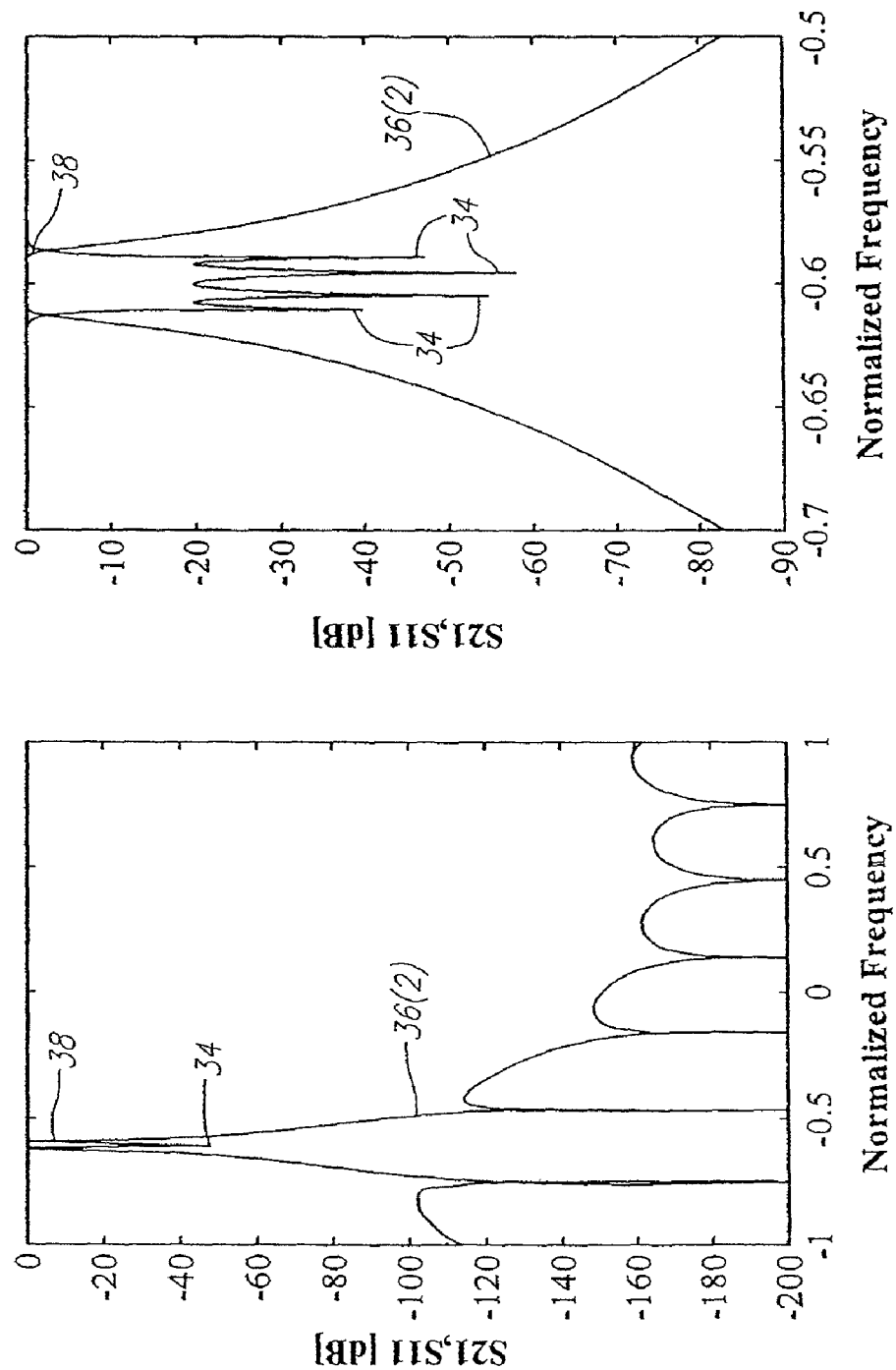
Figure 4C:
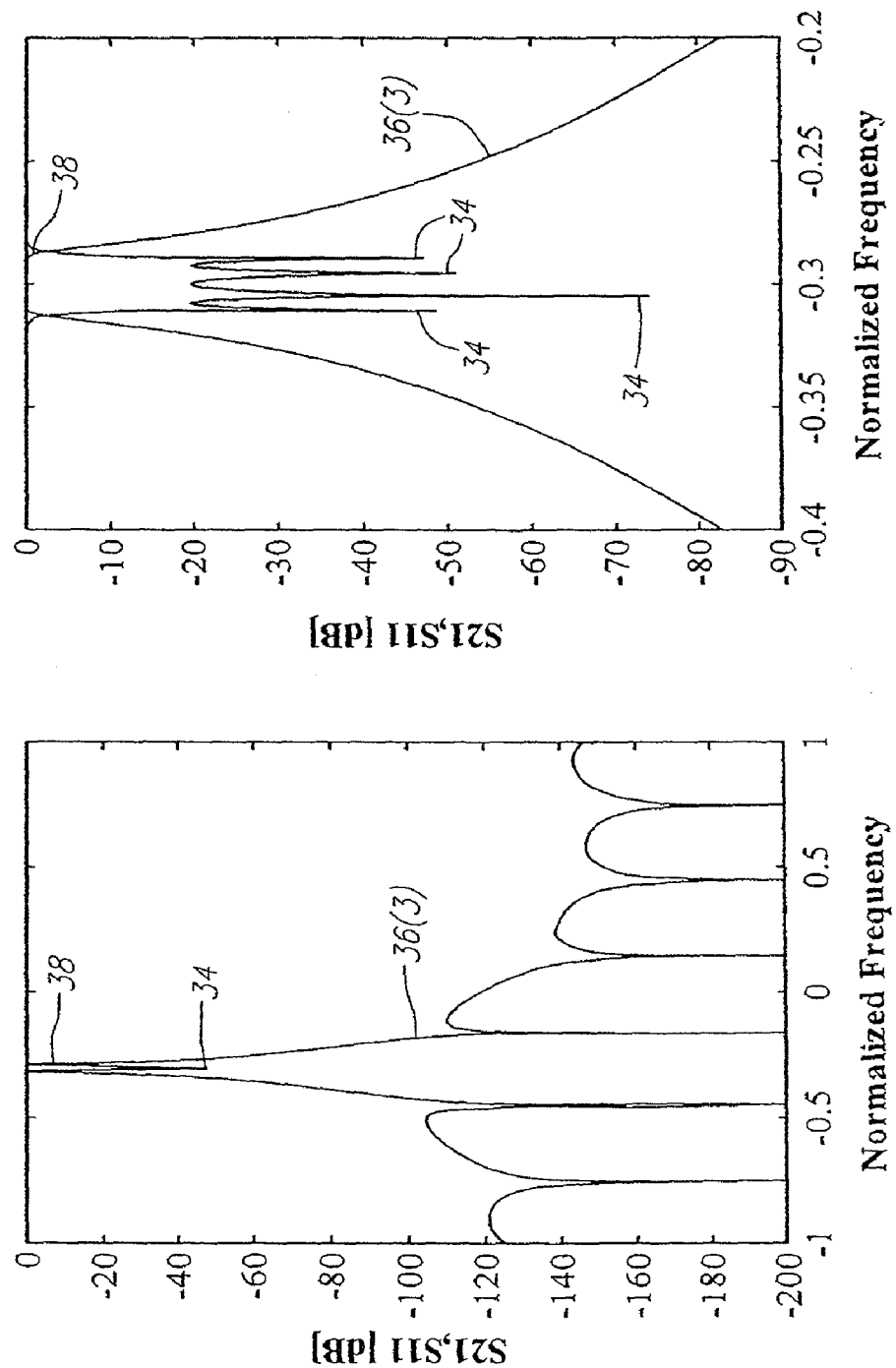
Figure 4D:
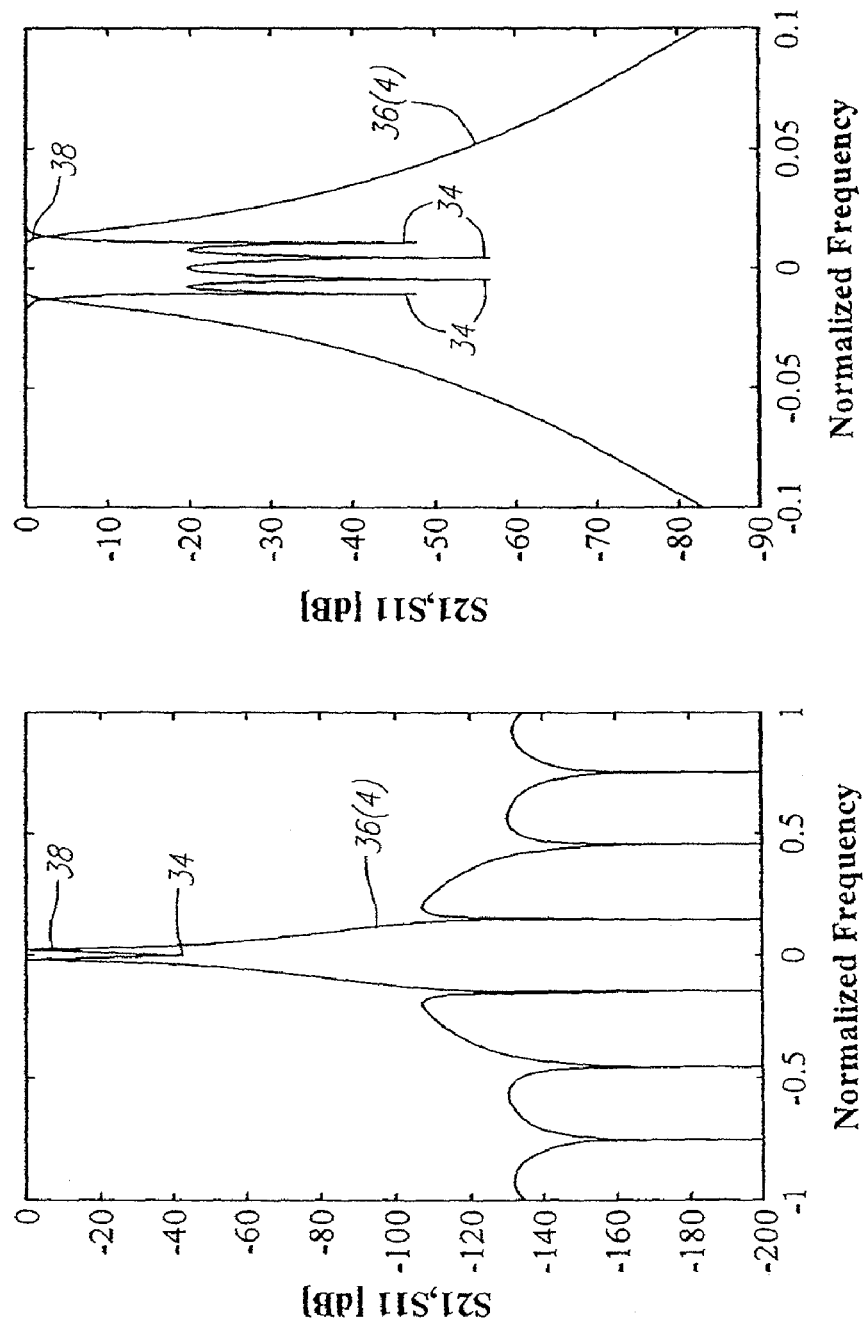
Figure 4E:
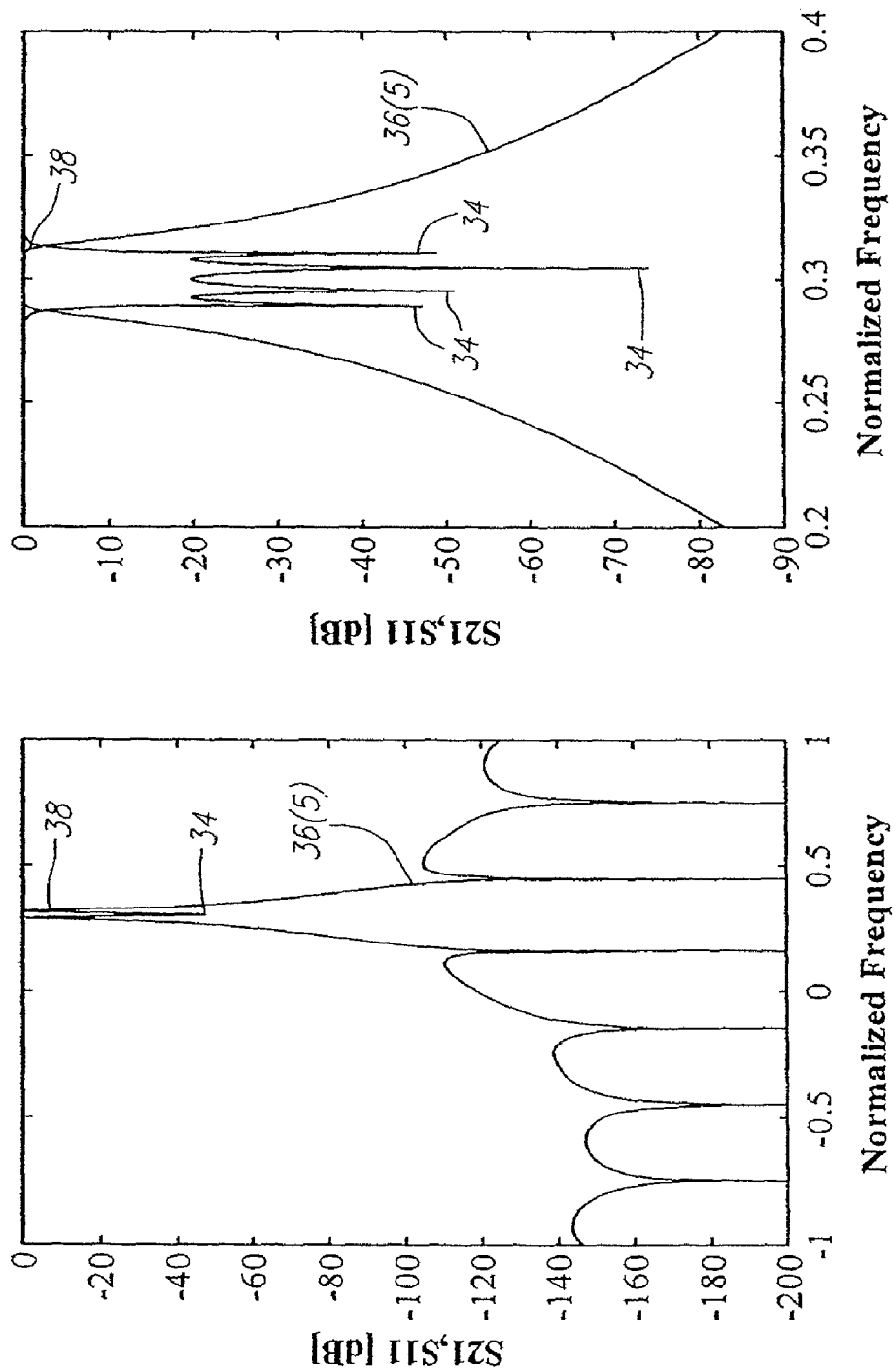
Figure 4F:
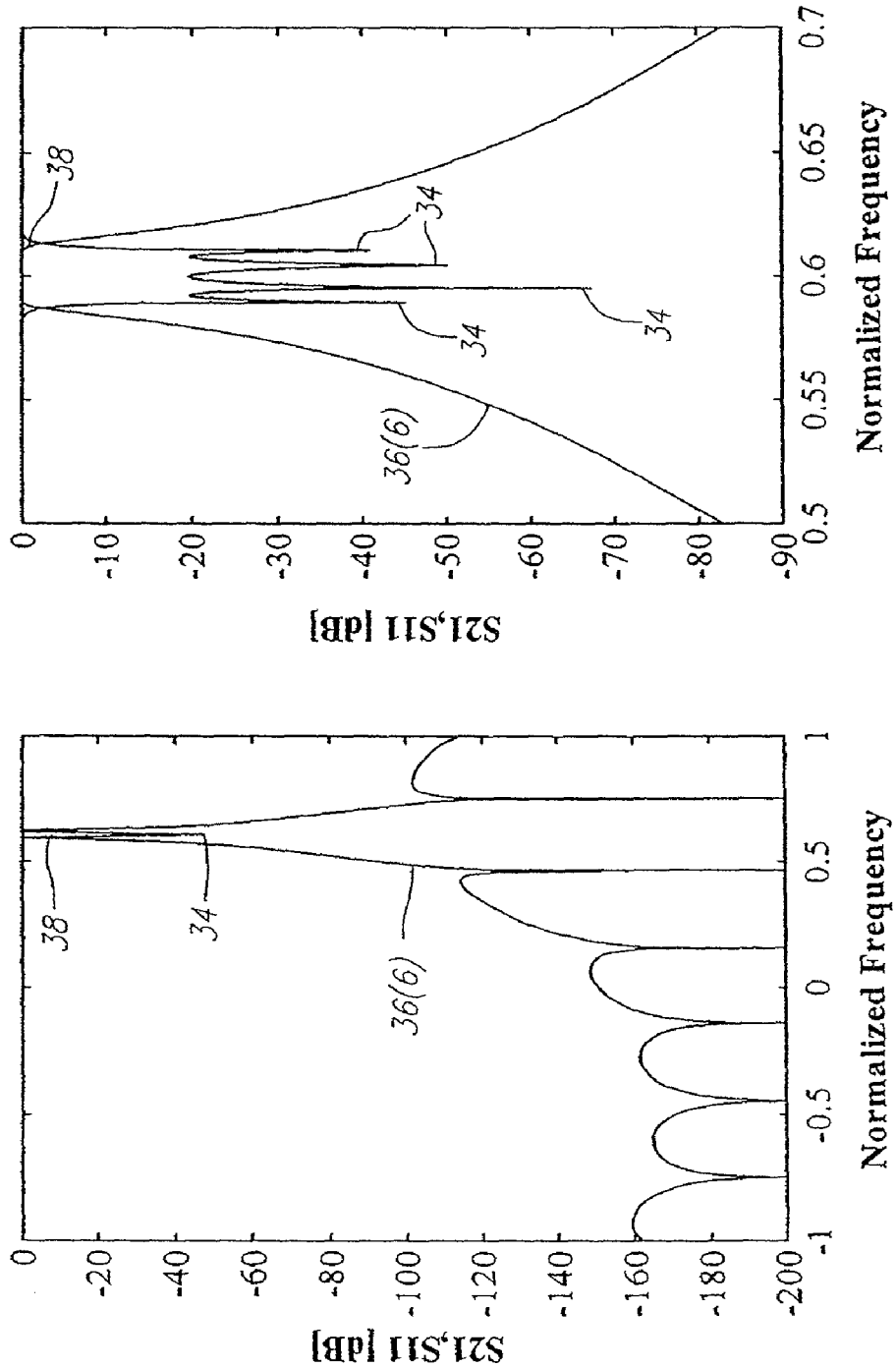
Figure 4G:
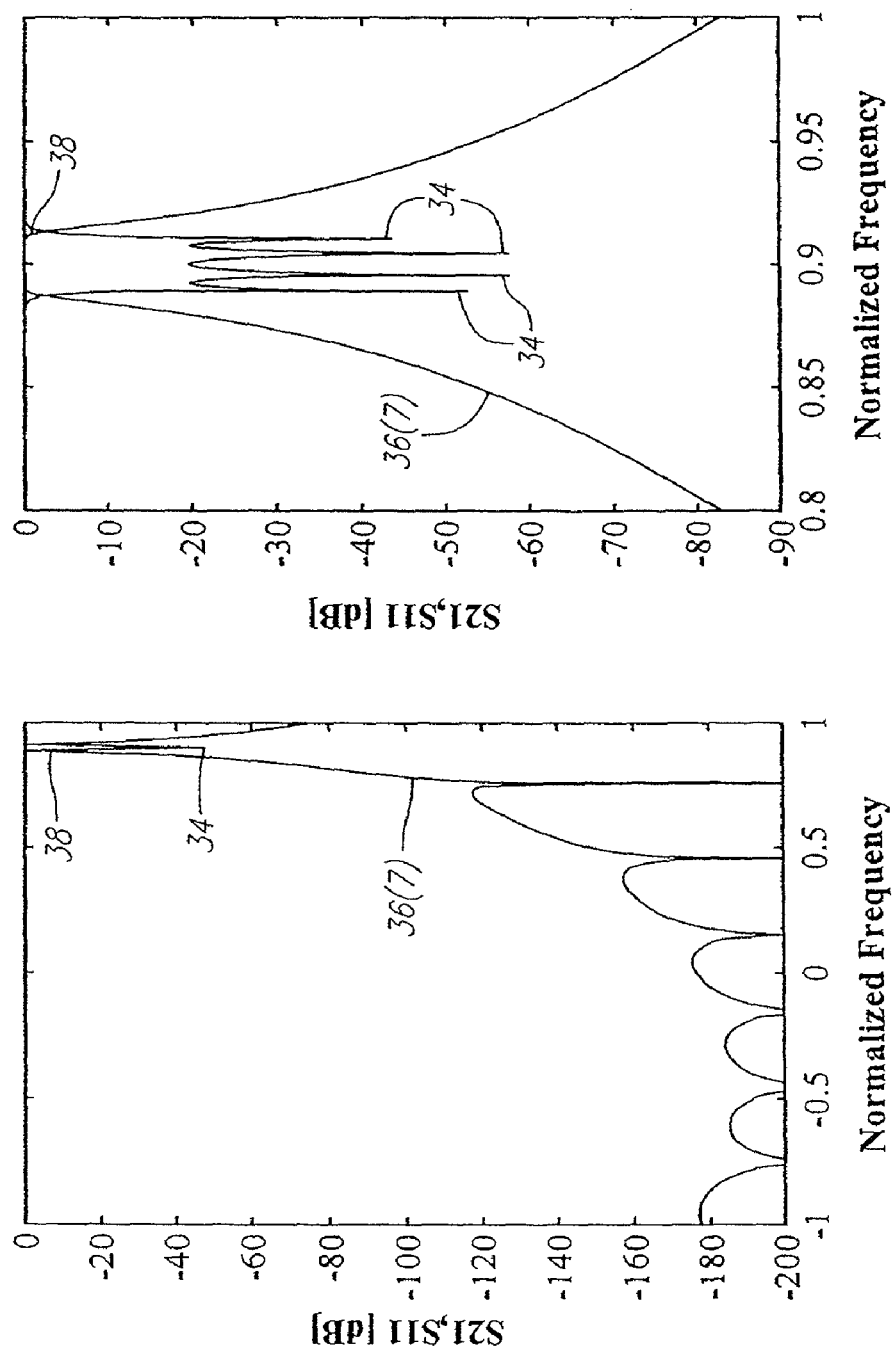

By way of example, if it is desired to center the pass band 38 at −0.20, the pass band 38 can be located in the third sub-band 36(3) (centered at −0.30 in FIG. 4(c)), and the transmission zeroes 30 can be displaced 0.10 from their nominal positions to move the pass band 38 from −0.30 to −0.20. If it is desired to center the pass band 38 at 0.85, the pass band 38 can be located in the seventh sub-band 36(7) (centered at 0.90 in FIG. 4(g)), and the transmission zeroes 30 can be displaced −0.05 from their nominal positions to move the pass band 38 from 0.90 to 0.85.

While the pass band 38 is illustrated in FIGS. 4(a)-4(g) as being centered within the sub-bands 36, the reflection zeroes 34 can be displaced within the stop band 32 (i.e., by adjusting the values of the non-resonant elements) to selectively move the pass band 38 within a selected sub-band 36. In this case, the pass band 38 can be hopped between sub-bands 36, as well as moved within each sub-band 36, thereby decreasing the amount the transmission zeroes 30 need to be adjusted for the pass band 38 to cover the continuum of the desired frequency range. For example, FIGS. 5(a)-5(d) illustrate exemplary filter responses, with respect to the center sub-band 36(4), where all of the transmission zeroes 30 are displaced 0.05 from their nominal positions (i.e., by increasing the frequencies of the resonant elements 18 by 0.05), and the reflection zeroes 34 are incrementally displaced by 0.05 (i.e., by adjusting the non-resonant elements 22) from their nominal positions.

Figure 5A:
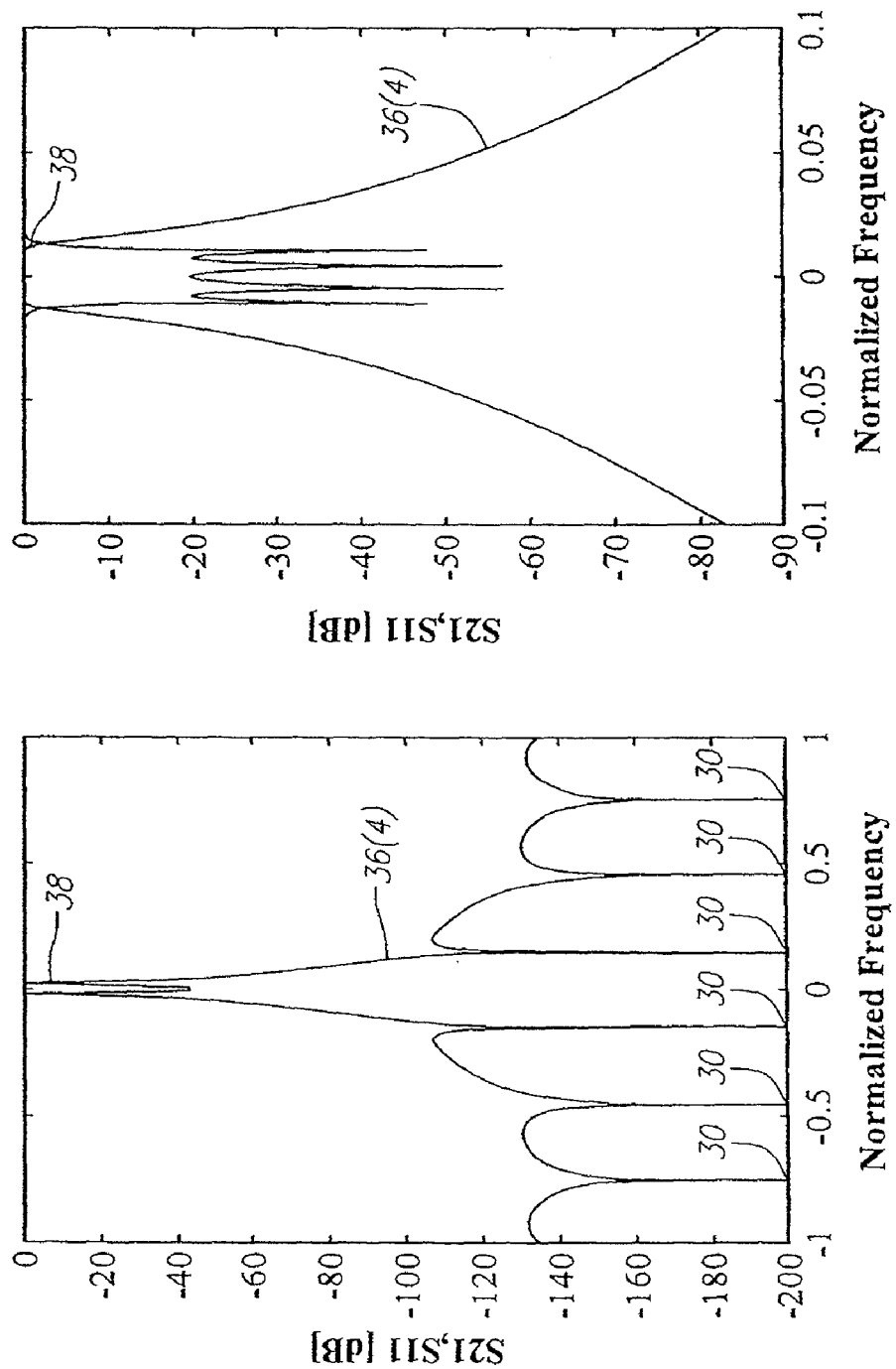
FIGS. 5(a)-5(d) are plots of the frequency response of FIG. 2, wherein the stop band has been shifted in frequency and a pass band has been introduced at various locations of a sub-band of the shifted stop band.
Figure 5B:
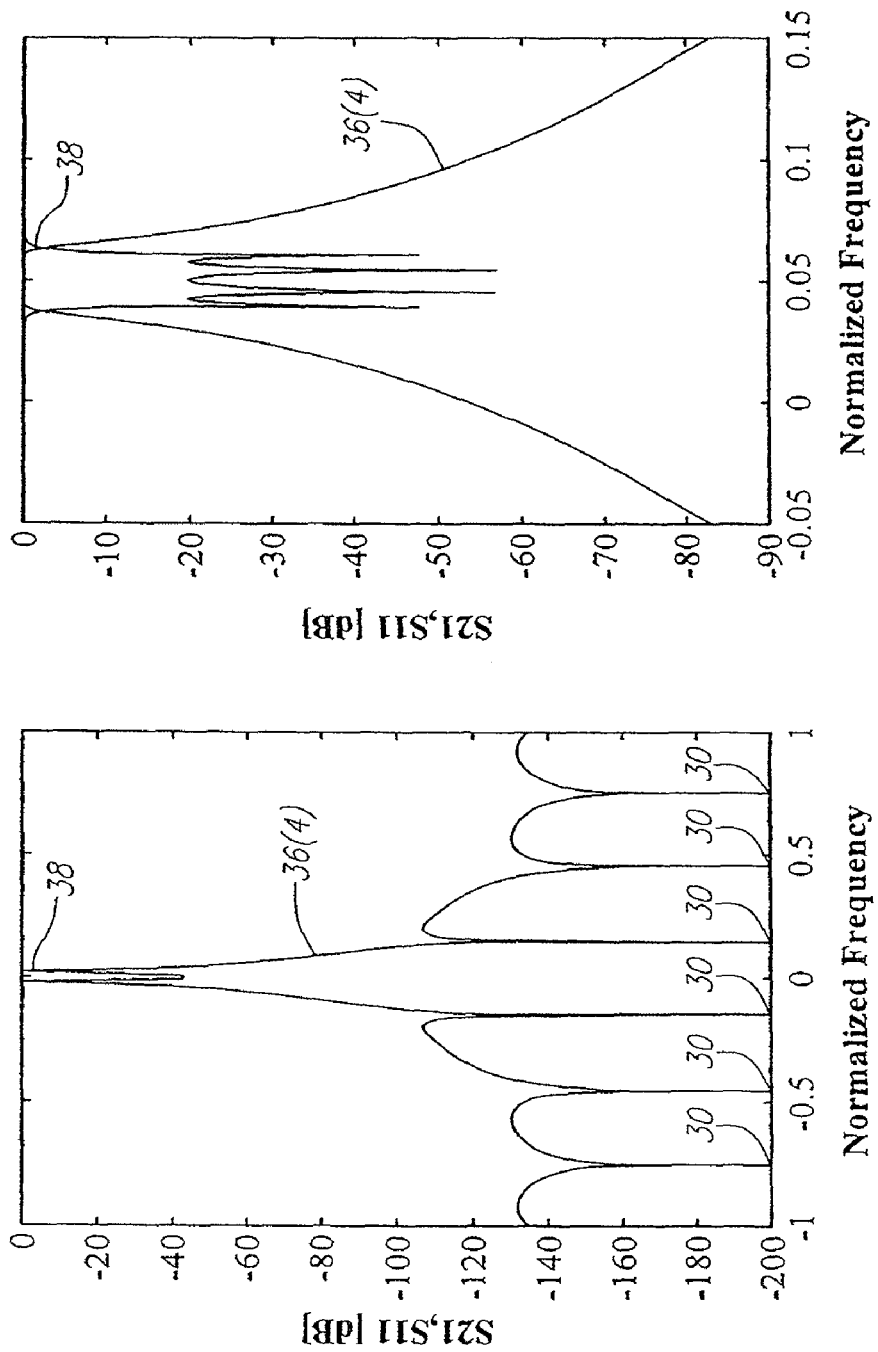
Figure 5C:
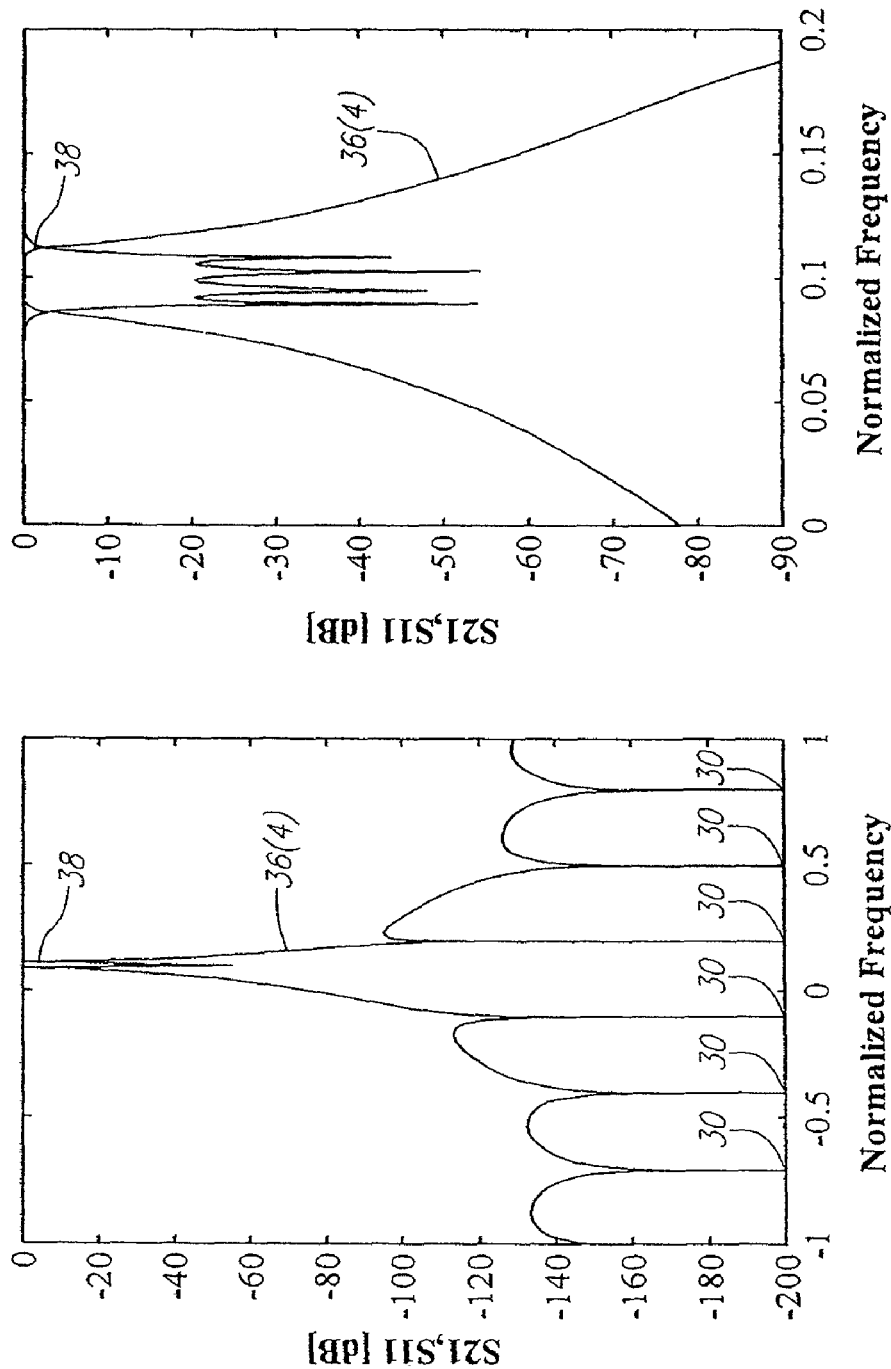
Figure 5D:
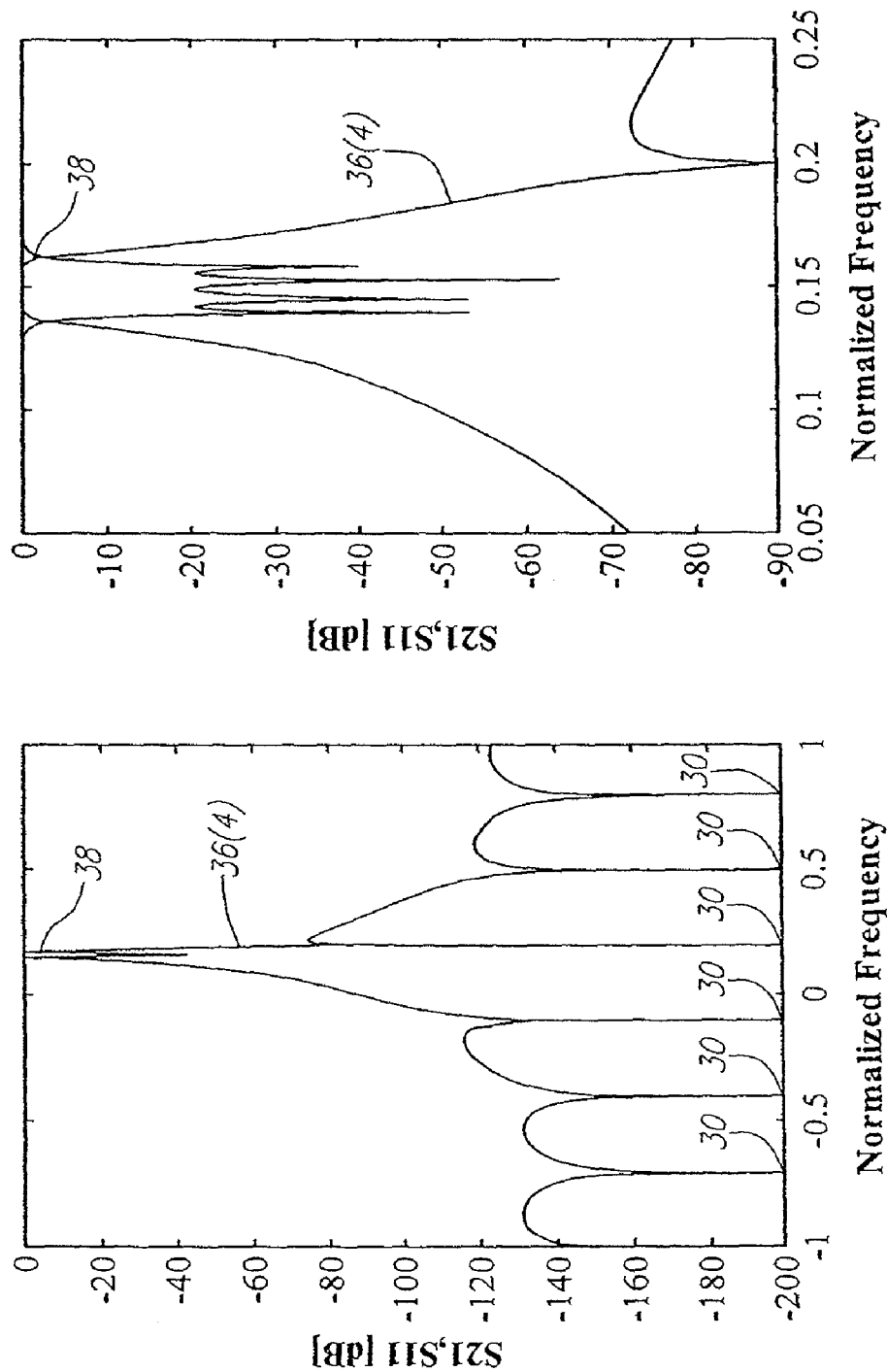

In particular, going sequentially through FIGS. 5(a)-5(d), the transmission zeroes 30 are displaced 0.05 from their nominal positions, thereby moving the pass band 38 from 0 (FIG. 5(a)) to 0.05 (FIG. 5(b)). Then, after fixing the transmission zeroes 30 in place, the reflection zeroes 34 are incrementally displaced 0.05 from their nominal positions to move the pass band 38 from the center of the sub-band 36(4) (0.05 in FIG. 5(b)) to a position 0.05 to the right of the center of the sub-band 36(4) (0.10 in FIG. 5(c)), and then to a position 0.10 to the right of the center of the sub-band 36(4) (0.15 in FIG. 5(d)).

While this modality may disrupt the symmetry of the rejection slope of the band-pass filter, in this case, it reduces the needed displacement of the transmission zeroes 30, and thus, the tuning range of the resonant elements, from 15% to 5%, to obtain the same tuning range as the case where the reflection zeroes 34 are not displaced within a sub-band 36. As a result, the loss of filter is further reduced.

Notably, while the transmission zeroes 30 may theoretically be displaced within the entirety of a sub-band 36, in which case, each pass band 38 can cover approximately 15% of the entire stop band 32 without having to tune the resonant elements, in reality, the filter loss significantly increases as a reflection zero 34 closely approaches a transmission zero 30. As such, it is preferable that the transmission zeroes 30 be displaced, along with the reflection zeroes 34, to allow the pass band 38 to move within the entire frequency range without significant loss.

Figure 6:
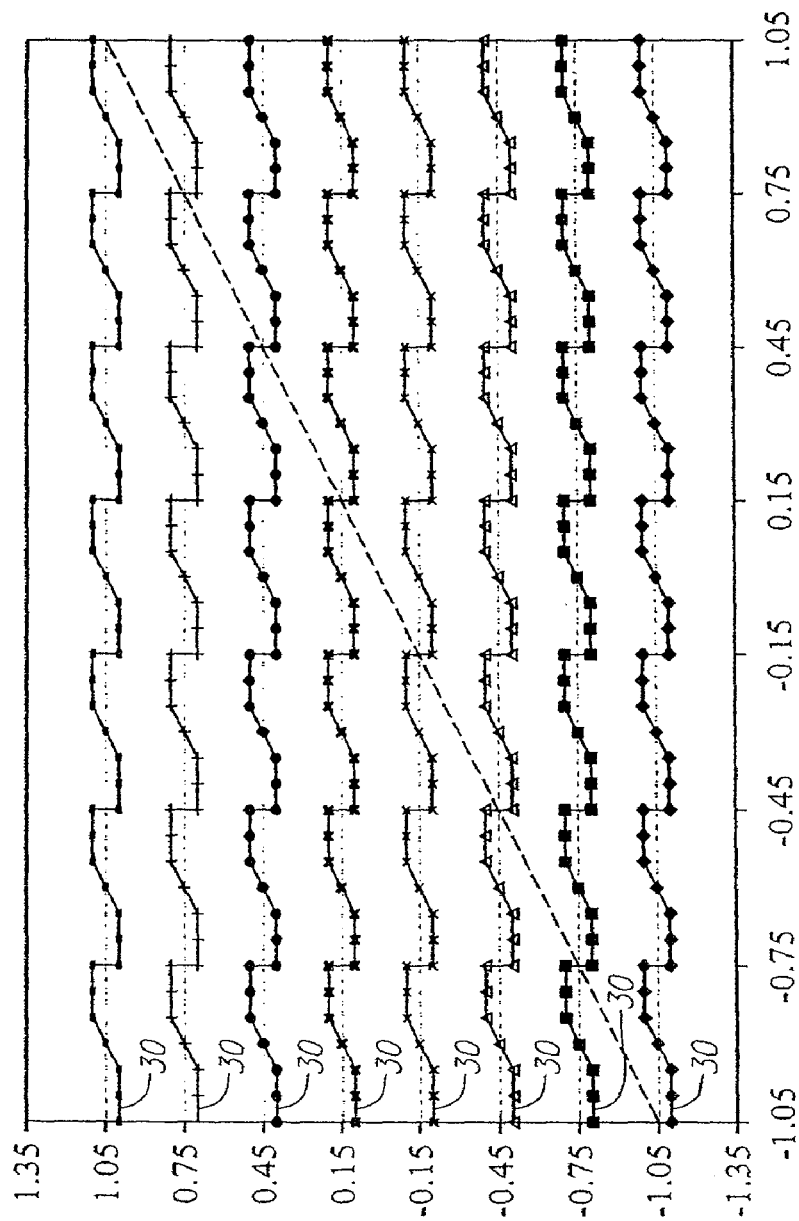
FIG. 6 is a plot illustrating the simultaneous shifting of transmission zeroes of the frequency response of FIG. 2 to extend the range of the pass band introduced within the selected sub-bands of the stop band of FIGS. 4(a)-4(g)
Figure 7A:
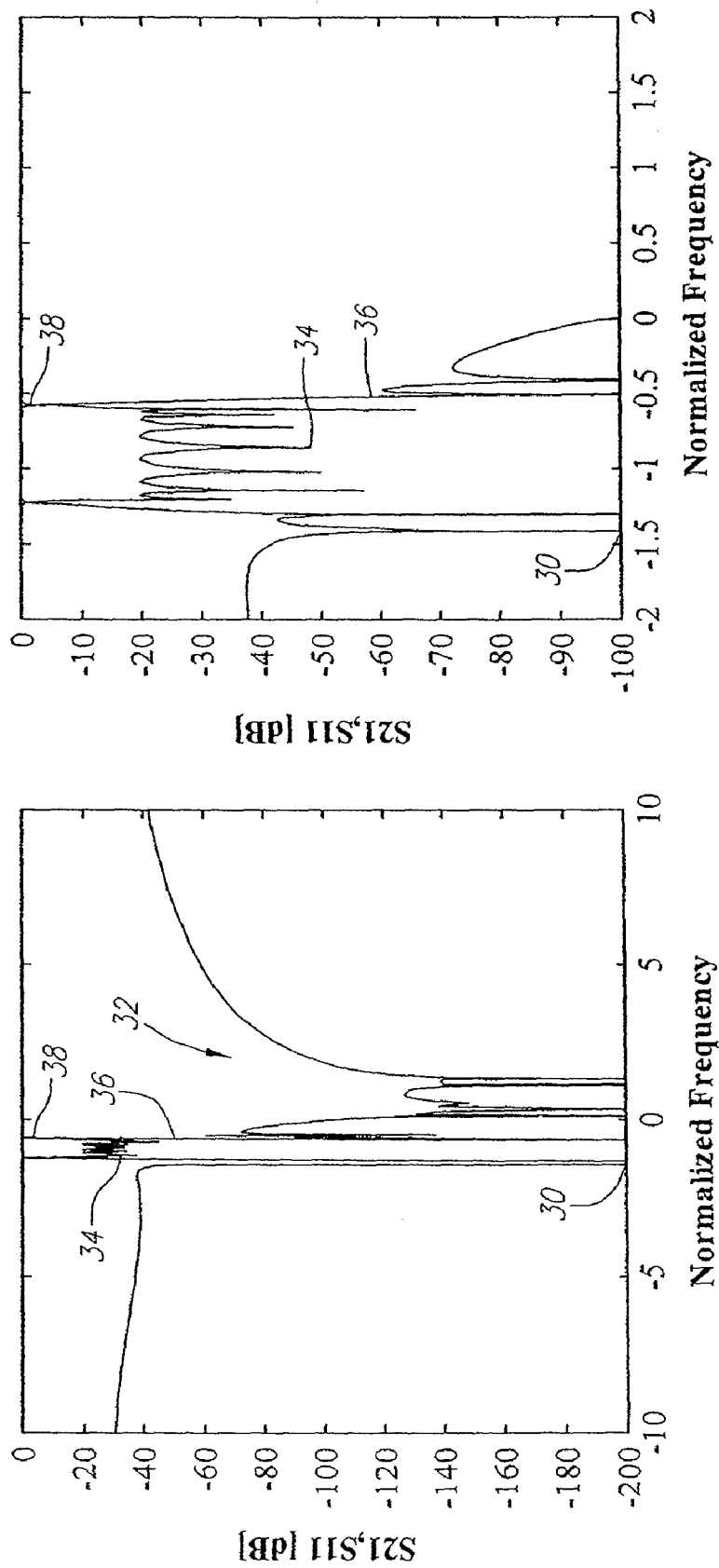
FIGS. 7(a)-7(f) are plots of a modeled frequency response of an exemplary wide stop band using nine resonant elements, wherein a pass band has been introduced within selected sub-bands of the stop band to cover the personal communications services (PCS) frequency range.
Figure 7B:
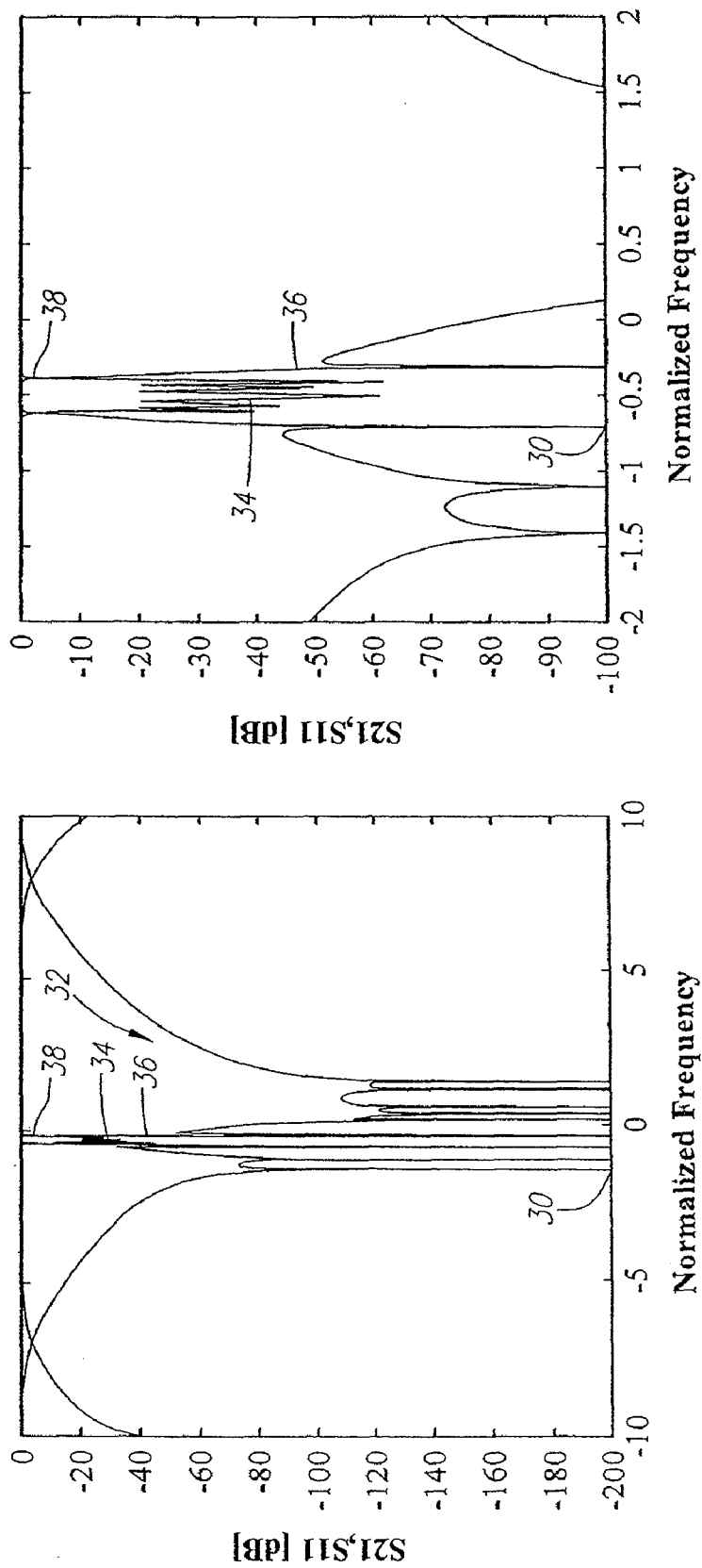
Figure 7C:
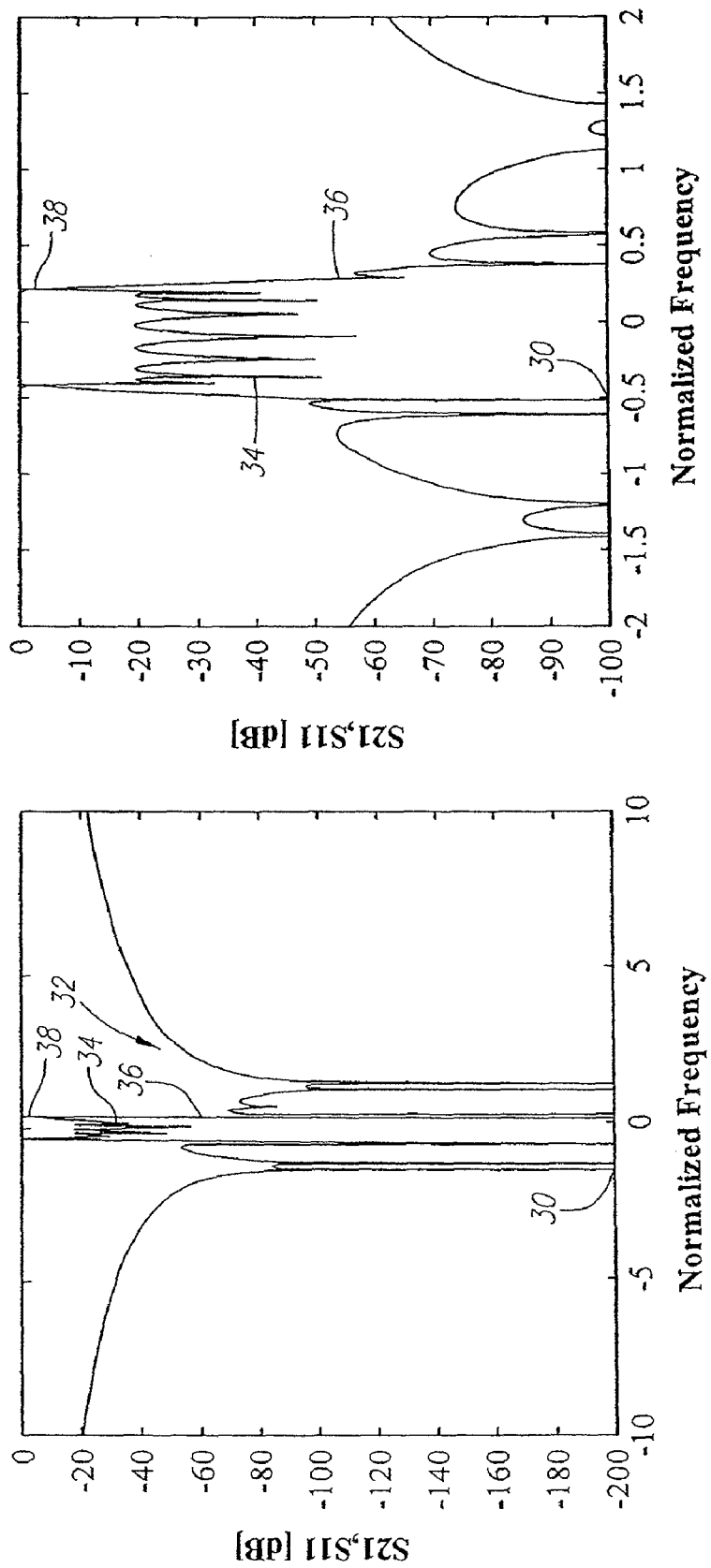
Figure 7D:
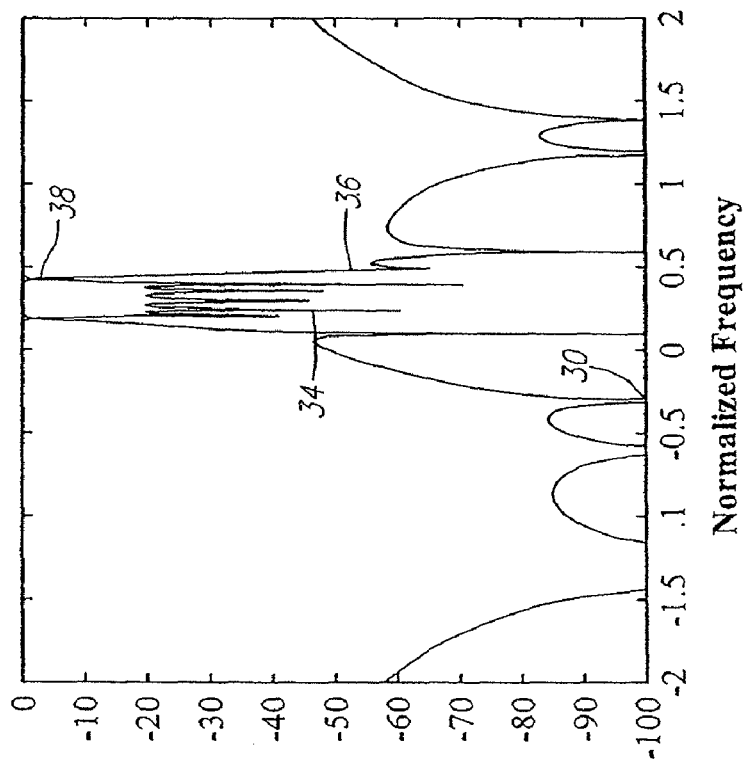
Figure 7D:
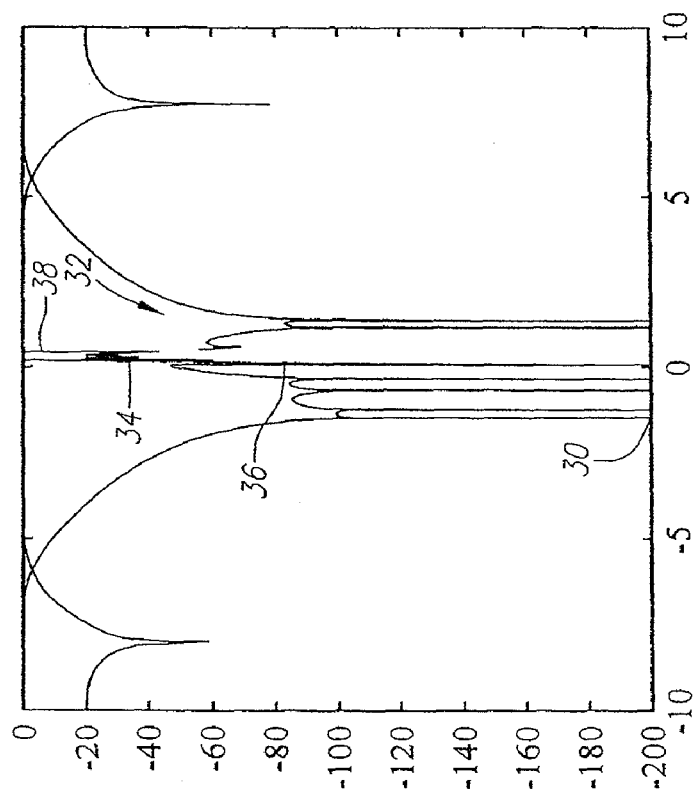
Figure 7E:
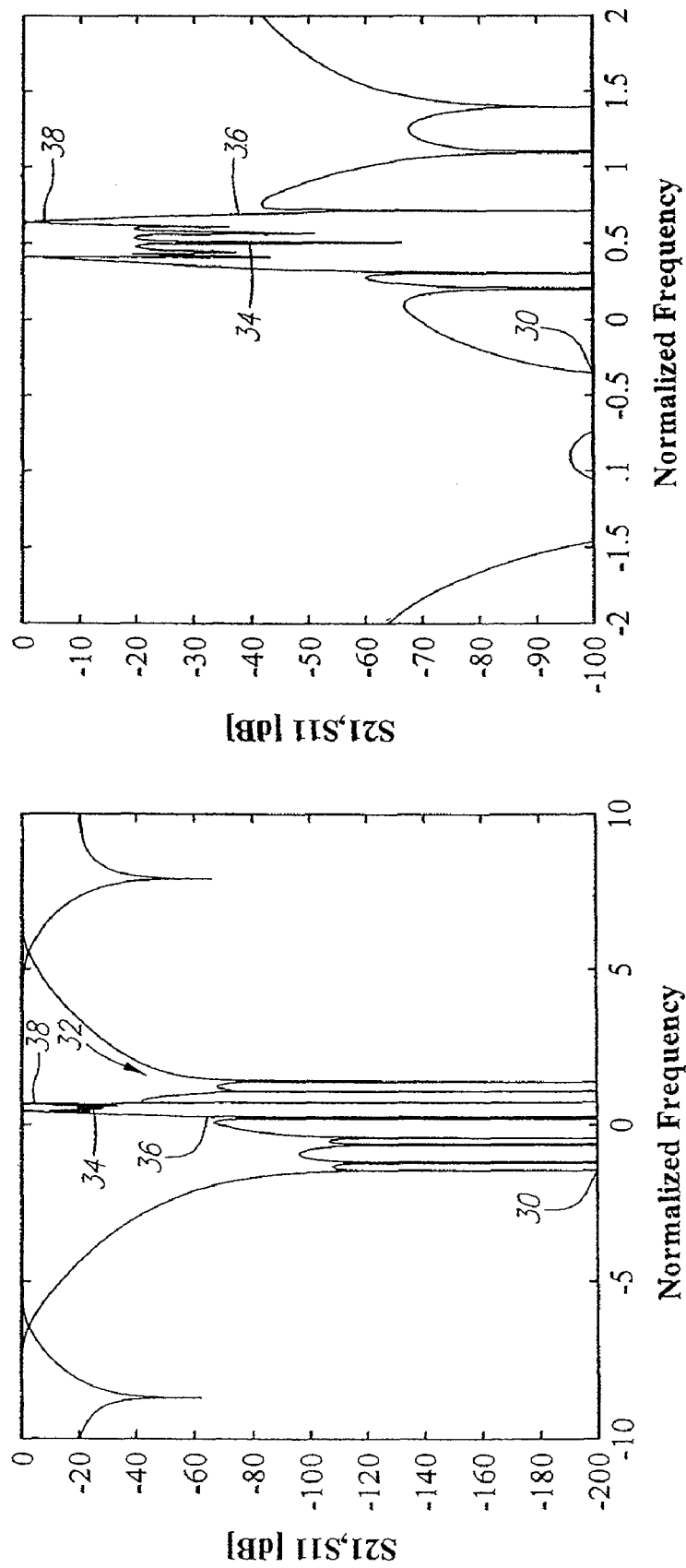
Figure 7F:
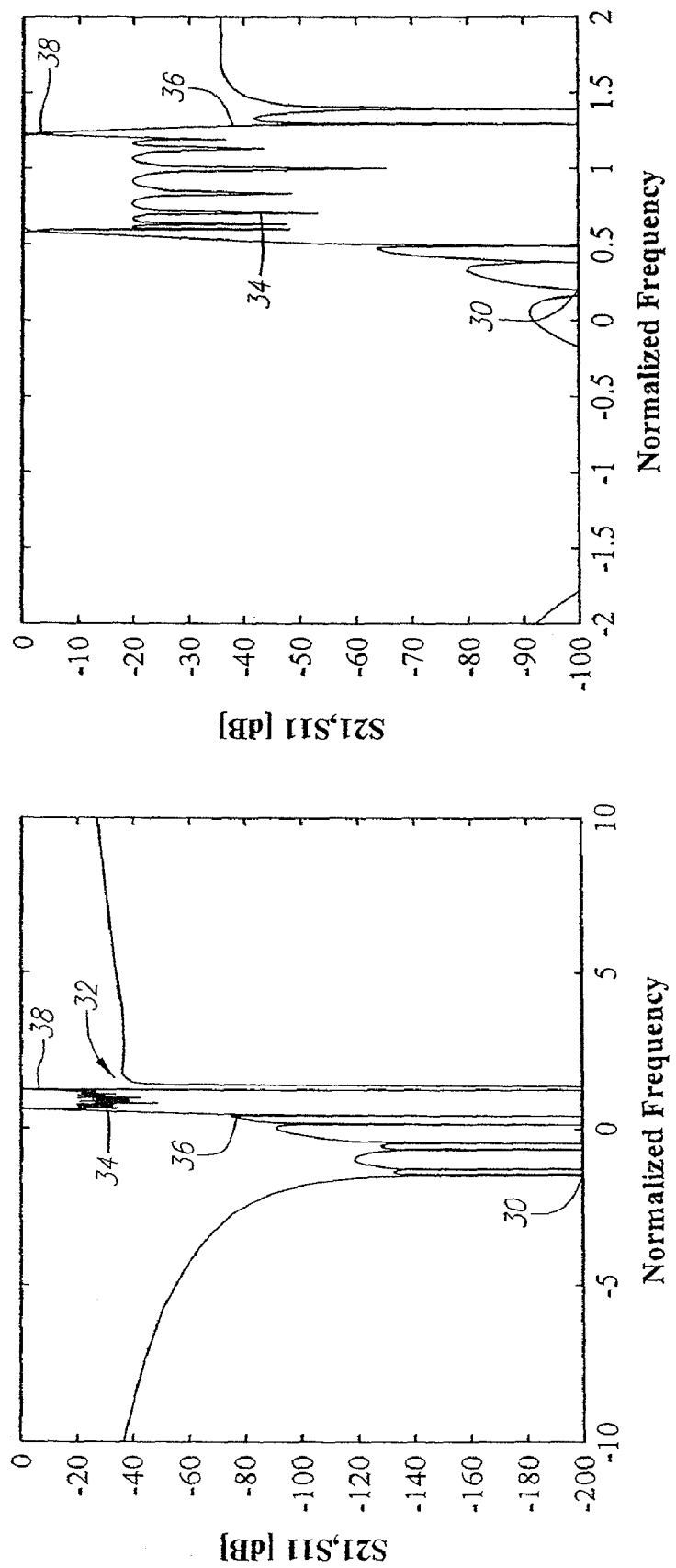

For example, referring to FIG. 6, the transmission zeroes 30 are displaced in a range of +/−0.05 relative to their nominal positions (shown by horizontal dashed lines) to allow the pass band 38 to be located anywhere within the nominal frequency range of −1.05 to 1.05 (as represented by the diagonal dashed line). As the frequency of pass band 38 moves from −1.05 to 1.05, the reflection zeroes 34 hop from one sub-band 36 to the next, with the reflection zeroes 34 being displaced along a sub-band 36 within a range of +/−0.10, and the transmission zeroes 30 being displaced within range of +/−0.05, for a total range of 0.30 between hops.

In particular, at the beginning of the tuning range, the transmission zeroes 30 will initially be positioned −0.05 relative to their nominal positions (i.e., −1.05, −0.75, −0.45, −0.15, 0.15, 0.45, 0.75, 1.05), which places the center the first sub-band 36(1) at −0.95, in which case, the reflection zeroes 34 will be initially positioned −0.10 relative to their nominal positions in the first sub-band 36(1) to place the pass band 38 at −1.05. While the transmission zeroes 30 are fixed, the reflection zeroes 34 can be displaced to their nominal positions in the first sub-band 36(1) to move the pass band 38 from −1.05 to −0.95. While the reflection zeroes 34 are fixed, the transmission zeroes 30 can then be displaced 0.05 relative to their nominal positions, which moves the center of the first sub-band 36(1) to −0.85, thereby moving the pass band from −0.95 to −0.85. While the transmission zeroes 30 are again fixed, the reflection zeroes 34 can be displaced 0.10 relative to their nominal positions to move the pass band 38 from −0.85 to −0.75.

Once the pass band 38 reaches −0.75, the reflection zeroes 34 will then hop from the first sub-band 36(1) to the second sub-band 36(2), and the transmission zeroes 30 will then again be displaced −0.05 relative to their nominal positions, which moves the center of the second sub-band 36(2) to −0.65, in which case, the reflection zeroes 34 will be initially positioned −0.10 relative to their nominal positions to maintain the pass band 38 at −0.75. The transmission zeroes 30 and reflection zeroes 34 are then moved in coordination with each other in the same manner described above with respect to the first sub-band 36(1) to move the pass band 38 from −0.75 to −0.45. Once the pass band 38 reaches −0.45, the reflection zeroes 34 will then hop from the second sub-band 36(2) to the third sub-band 36(3), and so forth, until the pass band 38 reaches 1.05.

While the RF filter 10 has been described above as being capable of tuning a narrow pass band within a continuum of the desired frequency range (i.e., the RF filter 10 can be reconfigured in a continuous manner), the RF filter 10 may be reconfigurable in a discrete manner, such that the pass band 38 can be discretely centered at selected regions of the frequency band. For example, in PCS applications, the RF filter 10 may be reconfigured to operate in any of the six A-F frequency bands by locating the narrow pass band at a selected one of these frequency bands.

FIGS. 7(a)-7(f) illustrate exemplary filter responses corresponding to six different reconfigured states of an RF filter. In this case, the modeled filter has nine transmission zeroes 30 (only seven shown) to create a stop band 32 with eight sub-bands 36 located between the respective transmission zeroes 30, and seven reflection zeroes 34 that can be displaced into the stop band 32 to create a pass band 38 within selected ones of the six middle sub-bands 36. Thus, the RF filter can be reconfigured to operate in the A-Band (FIG. 7(a)), D-Band (FIG. 7(b)), B-Band (FIG. 7(c)), E-Band (FIG. 7(d)), F-Band (FIG. 7(e)), or C-Band (FIG. 7(f)) of the PCS communications protocol. As shown, the width of the pass band 38 differs within the sub-bands 36, as dictated by the separation of adjacent transmission zeroes 30. In particular, the widths of the A-, B-, and C-Bands are approximately two-and-half greater than the widths of the D-, E-, and F-Bands.

Figure 8:
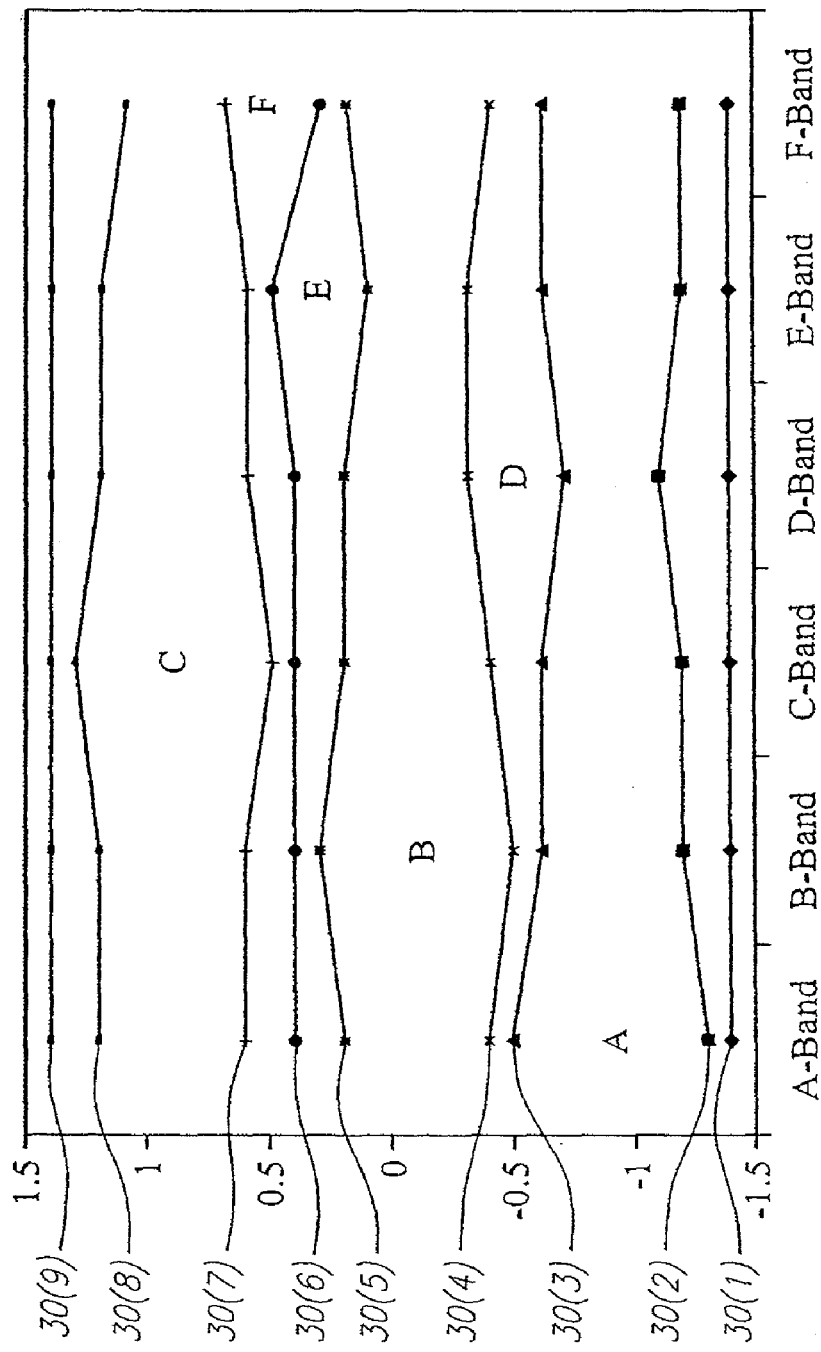
FIG. 8 are plots illustrating the independent shifting of transmission zeroes of the frequency response of FIGS. 7(a)-7(f) to accommodate the introduction of the pass band within the selected sub-bands of the stop band.
Figure 9A:
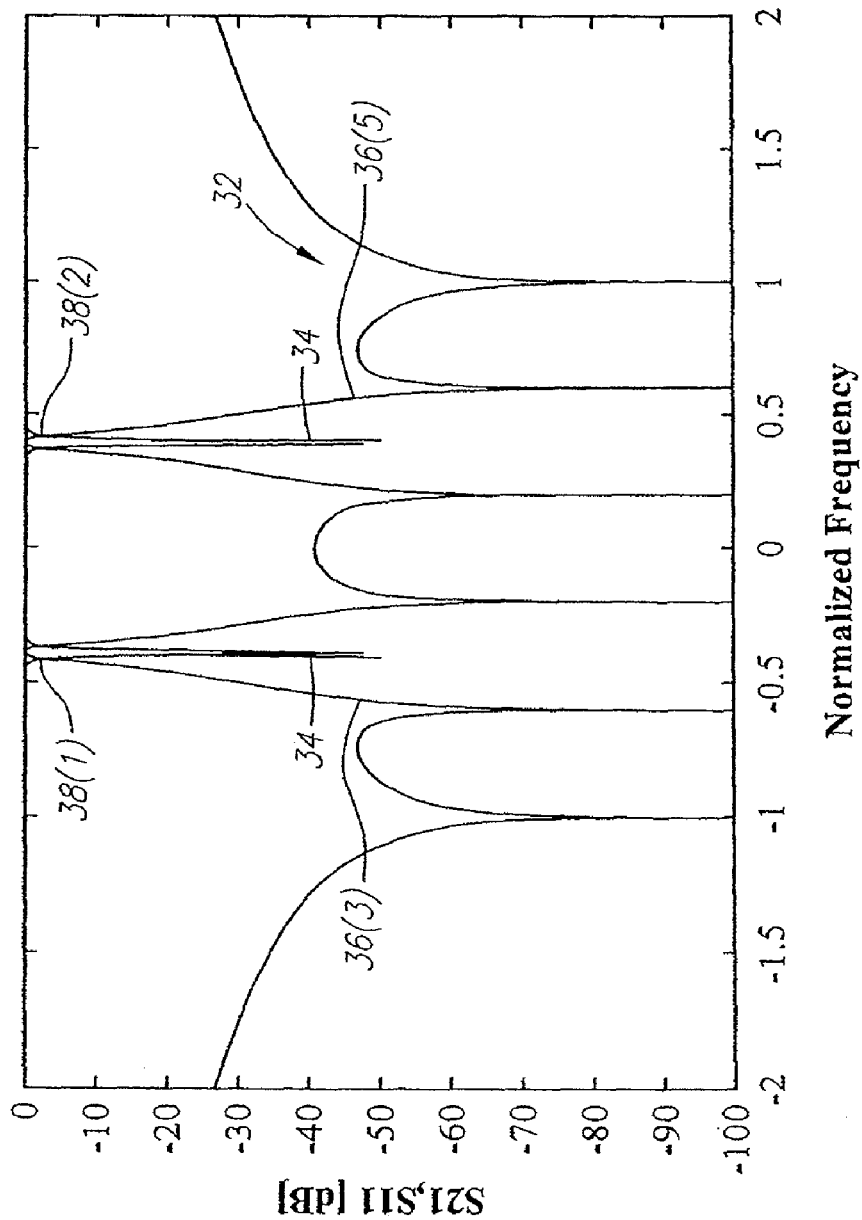
FIGS. 9(a)-9(e) are plots of a modeled frequency response of FIG. 2, wherein multiple pass bands have been introduced within selected sub-bands of the stop band.
Figure 9B:
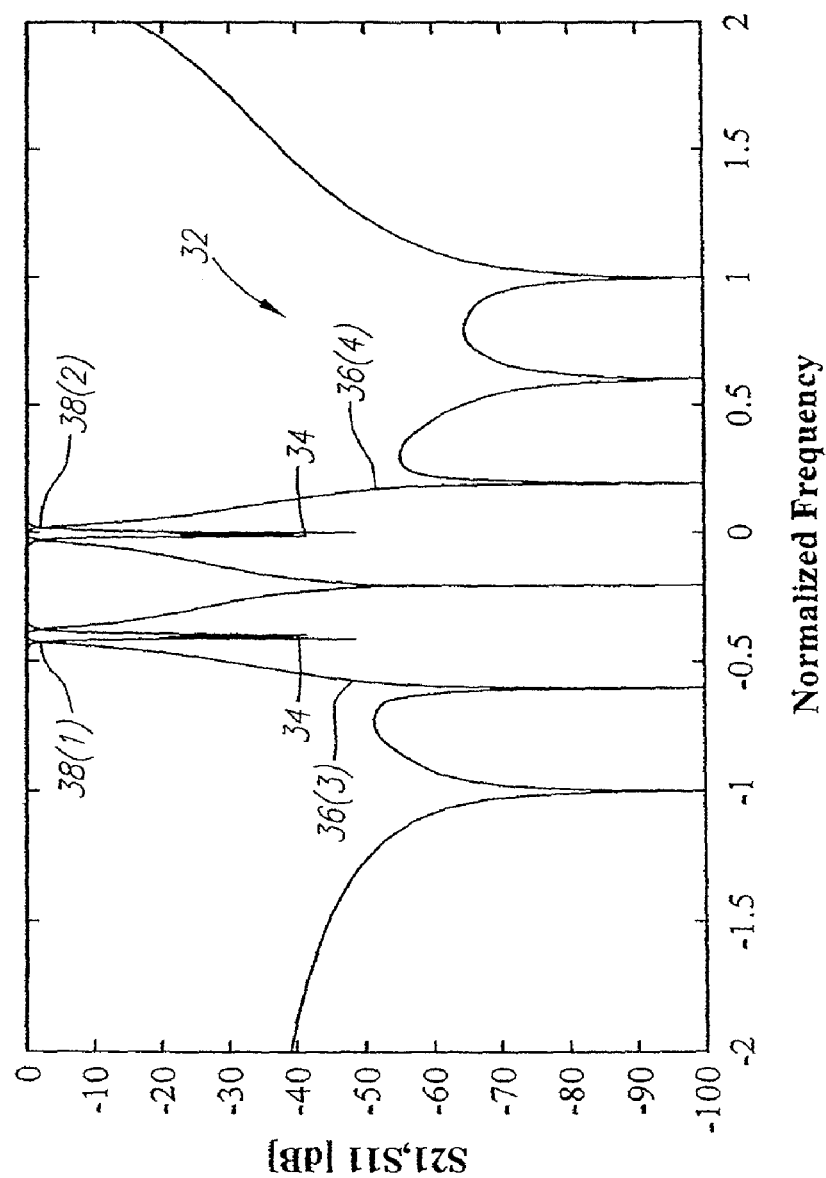
Figure 9C:
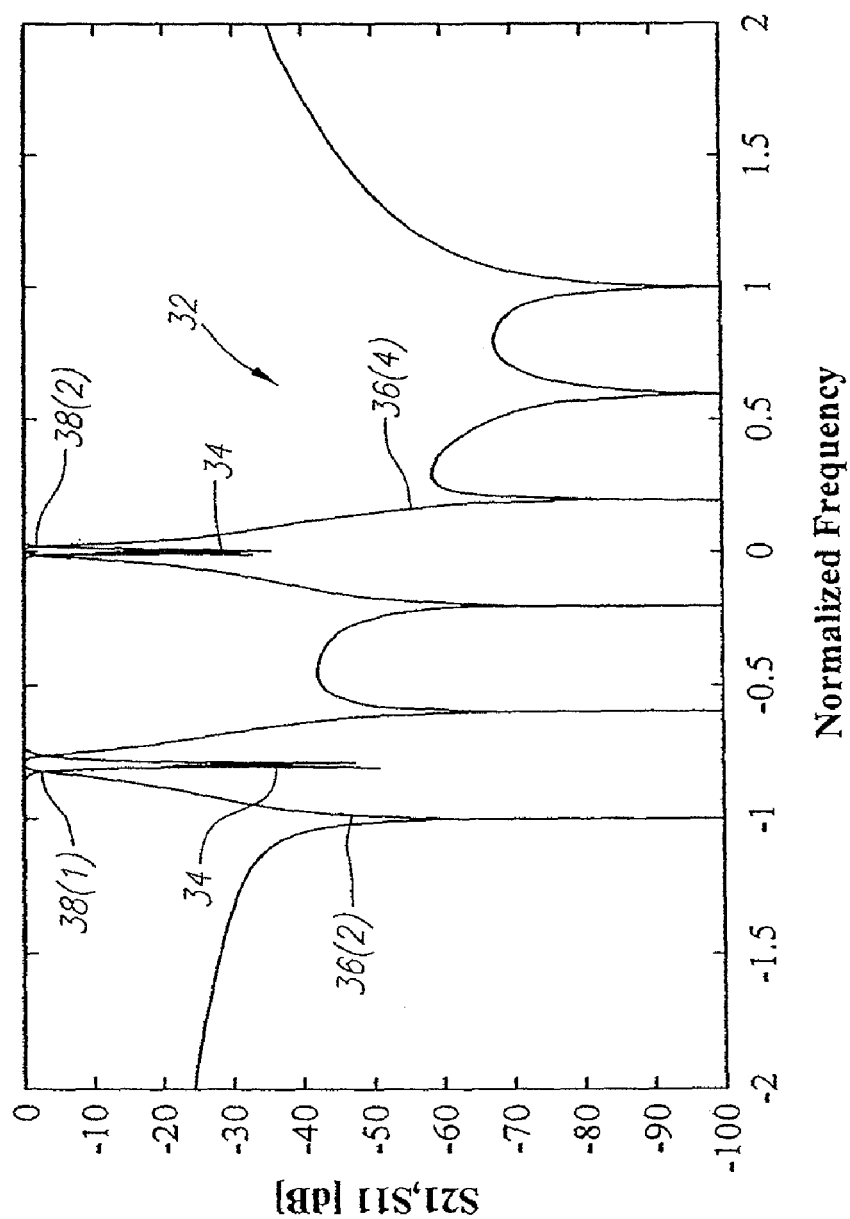
Figure 9D:
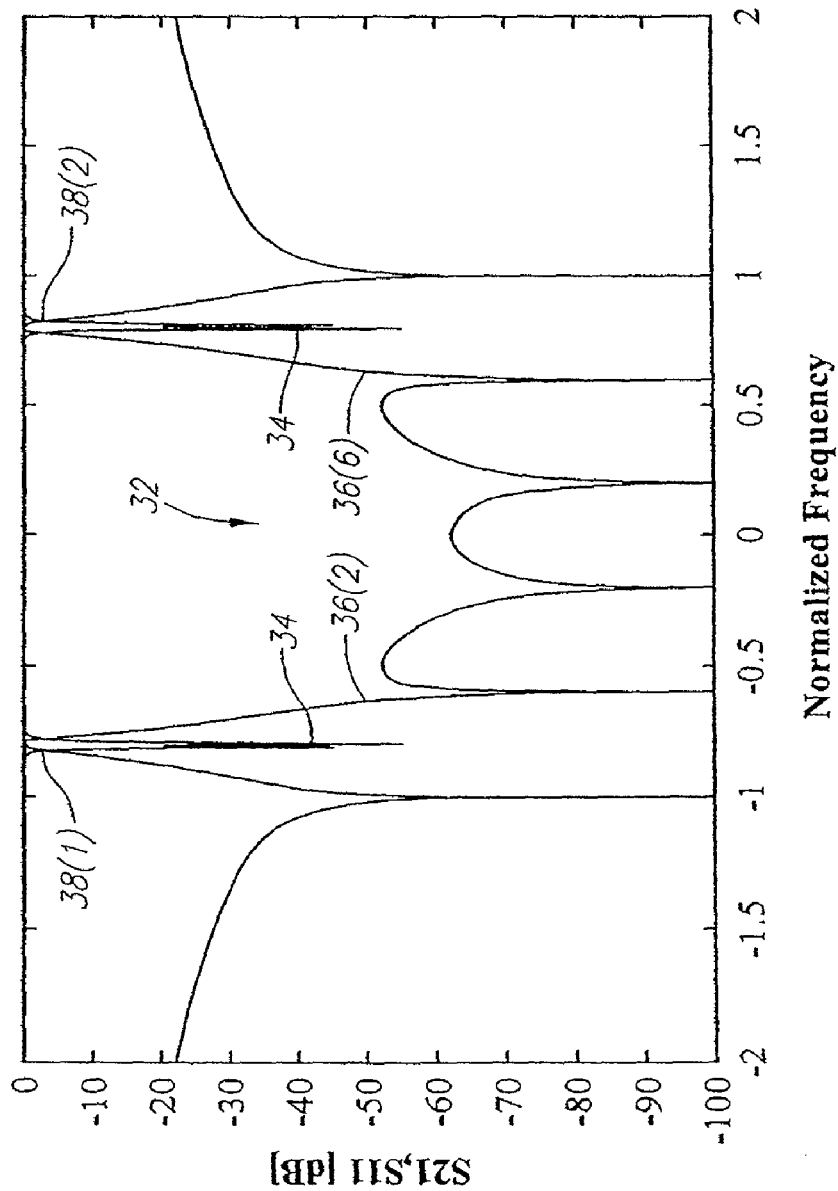
Figure 9E:
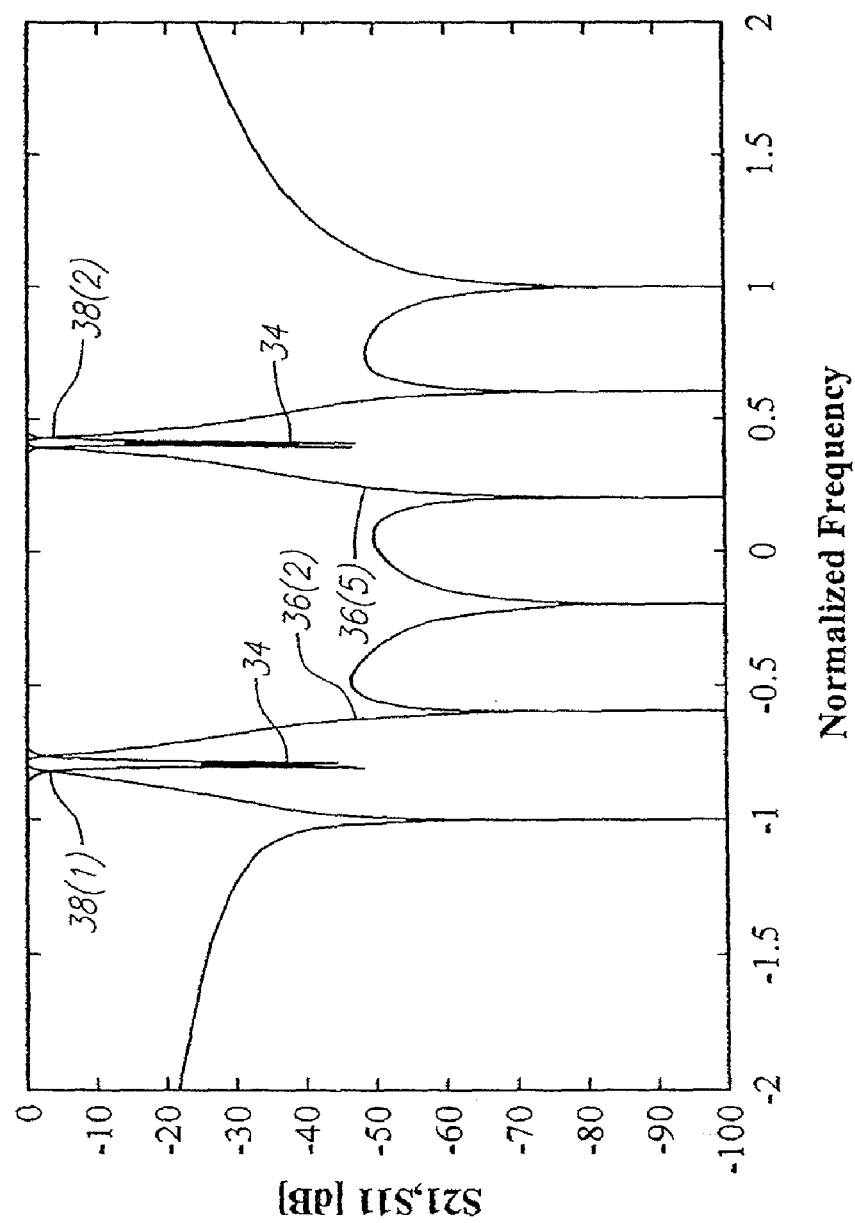

Notably, because, in this reconfigurable implementation, the pass band 38 need not be moved within a continuum of the desired frequency range, but rather is designed to be broad enough to cover the desired frequency range, the transmission zeroes 30 are not displaced to extend the range of the pass band 38. Rather, as illustrated in FIG. 8, the transmission zeroes 30 are independently displaced from their nominal positions to make room for the pass band 38 or otherwise improve rejection performance. For example, the second and third transmission zeroes 30(2), 30(3) are moved away from each other to make room for the reflection zeroes 34 at the A-Band; the fourth and fifth transmission zeroes 30(4), 30(5) are moved away from each other to make room for the reflection zeroes at the B-Band, the seventh and eighth transmission zeroes 30(7), 30(8) are moved away from each other to make room for the reflection zeroes at the C-Band; the third and fourth transmission zeroes 30(3), 30(4) are moved away from each other to make room for the reflection zeroes 34 at the D-Band, the fifth and sixth transmission zeroes 30(5), 30 (6) are moved away from each other to make room for the reflection zeroes 34 at the E-Band; and the sixth and seventh transmission zeroes 30(6), 30(7) are moved away from each other to make room for the reflection zeroes 34 at the F-Band.

Although the foregoing techniques have been described as introducing a single pass band 38 (i.e., one pass band at a time) within the stop band 32, multiple pass bands can be introduced within the stop band 32. For example, FIGS. 9(a)-9(e) illustrate exemplary filter responses where two sets of four reflection zeroes 34 have been displaced within the stop band 32 to selectively create two pass bands 38(1), 38(2) in the centers of selected pairs of the sub-bands 36. That is, going sequentially through FIGS. 9(a)-9(e), the pass bands 38(1), 38(2) are introduced into the third and fifth sub-bands 36(3), 36(5) (FIG. 9(d)), into the third and fourth sub-bands 36(3), 36(4) (FIG. 9(b)), into the second and fourth sub-bands 36(2), 36(4) (FIG. 9(c)), into the second and sixth sub-bands 36(2), 36(6) (FIG. 9(d)), and second and fifth sub-bands 36(2), 36(5) (FIG. 9(e)).

Figure 10:
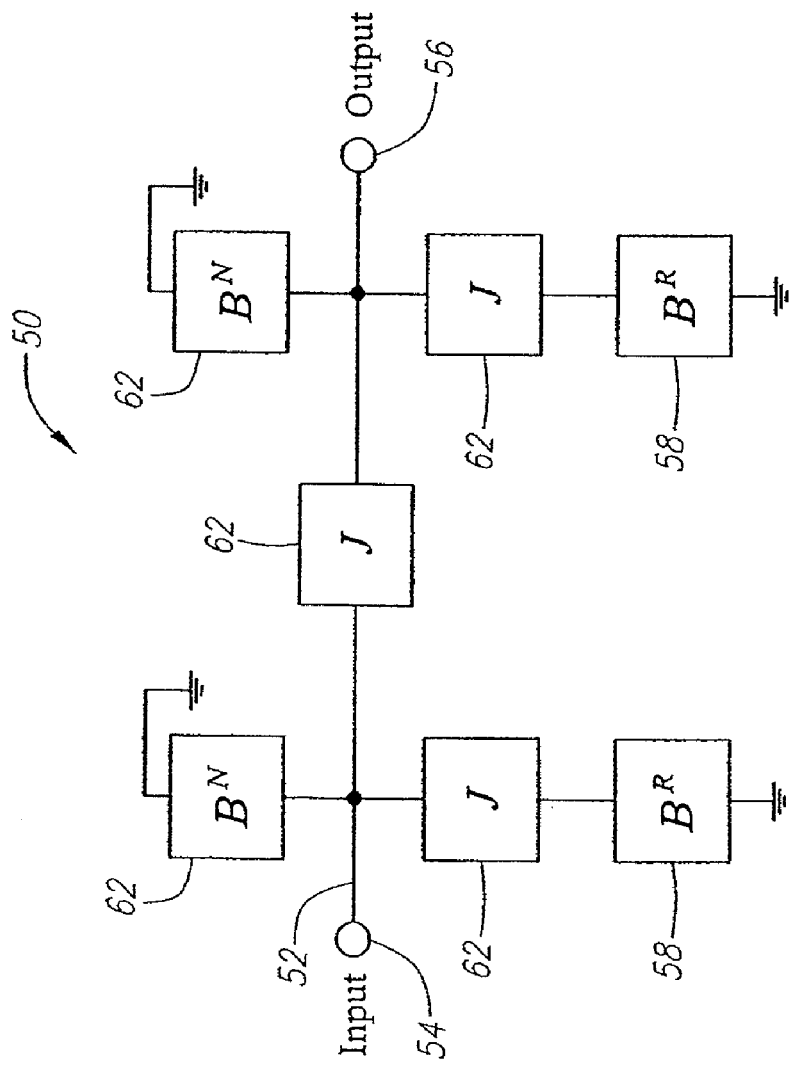
FIG. 10 is a block diagram of a tunable RF filter constructed in accordance with another embodiment of the present inventions.
Figure 11:
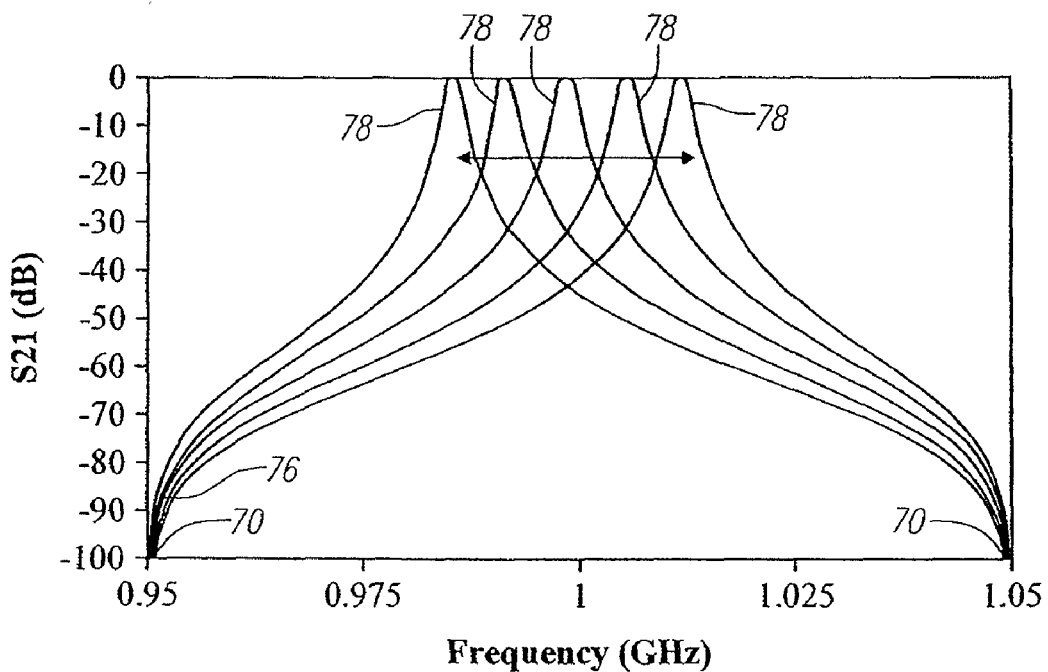
FIG. 11 is a plot of a modeled frequency response of the filter of FIG. 10, wherein a pass band has been introduced at various locations of the sub-band of the shifted stop band.

Referring now to FIGS. 10 and 11, a basic tunable filter 50 will be described for the purposes of explaining the correlation between the values of variable non-resonant elements (in terms of coupling values) and the movement of a resulting narrow pass band within a wide stop band. As shown in FIG. 10, the RF filter 50 generally comprises a signal transmission path 52 having an input 54 and an output 56, a plurality of resonant elements 58 (in this case two) between the input 54 and output 56, and a plurality of non-resonant elements 62 coupling the resonant elements 58 together. Tuning elements (not shown) can be used to adjust the frequencies of the resonant elements 58, and an electrical controller (not shown) can be used to tune the RF filter 50 to a selected narrow-band within the frequency range. Like the filter 10 illustrated in FIG. 1, the resonant elements 58 of the filter 50 are represented by susceptance $B^R$, and the non-resonant elements 62 are represented by susceptance $B^N$, which are coupled in parallel with the resonant elements 58, and admittance inverters J, which are coupled between the resonant elements 58. Selected ones of the non-resonant elements 22 can be varied (in this case, the susceptances $B^N$), while any remaining ones of the non-resonant elements 22 remained fixed (in this case, the admittance inverters J).

The filter 50 was modeled to create the exemplary filter response illustrated in FIG. 11. The frequencies of the two resonant elements 58, and thus two transmission zeroes 70, were set at 0.95 GHz and 1.05 GHz, thereby creating a stop band (not shown) having a normalized frequency range between 0.95 GHz and 1.05 GHz. In this case, because there are only two resonant elements 58, a single sub-band 76 is centered between the transmission zeroes 70 at 1.00 GHz. Thus, reflection zeroes (not shown) are introduced and displaced along the stop-band only to move a pass-band 78 within the single sub-band 76 (five positions of the pass-band 78 shown)

Figure 12:
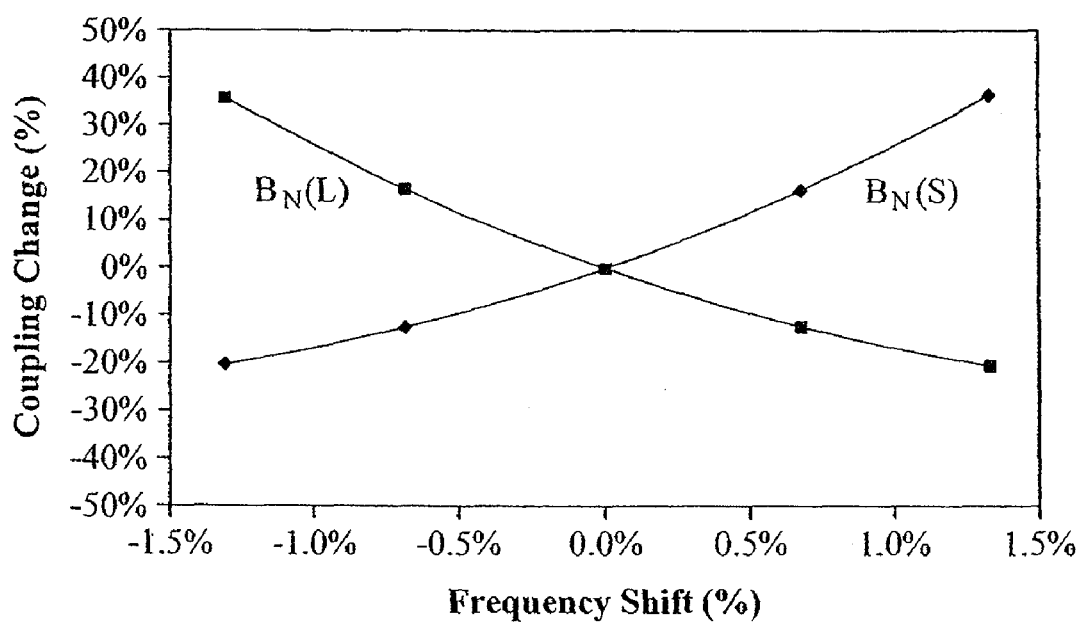
FIG. 12 is a plot illustrating the variation of coupling values of non-resonant elements used in the tunable RF filter of FIG. 10 versus a frequency shift in the pass-band of FIG. 11.

As further illustrated in FIGS. 11 and 12, the variable non-resonant elements 66 (designated in FIG. 12 as $B^N(L)$ and $B^N(S)$) can be adjusted to move the pass band 78 about the nominal frequency of 1.00 GHz by changing their coupling values. In particular, the pass band 78 will decrease in frequency (move left) as the percentage coupling value of the load-side non-resonant element $B^N(L)$ increases and the percentage coupling value of the source-side non-resonant element $B^N(S)$ decreases, and will increase in frequency (move right) as the percentage coupling value of the load-side non-resonant element $B^N(L)$ decreases and the percentage coupling value of the source-side non-resonant element $B^N(S)$ increase.

Figure 13A:
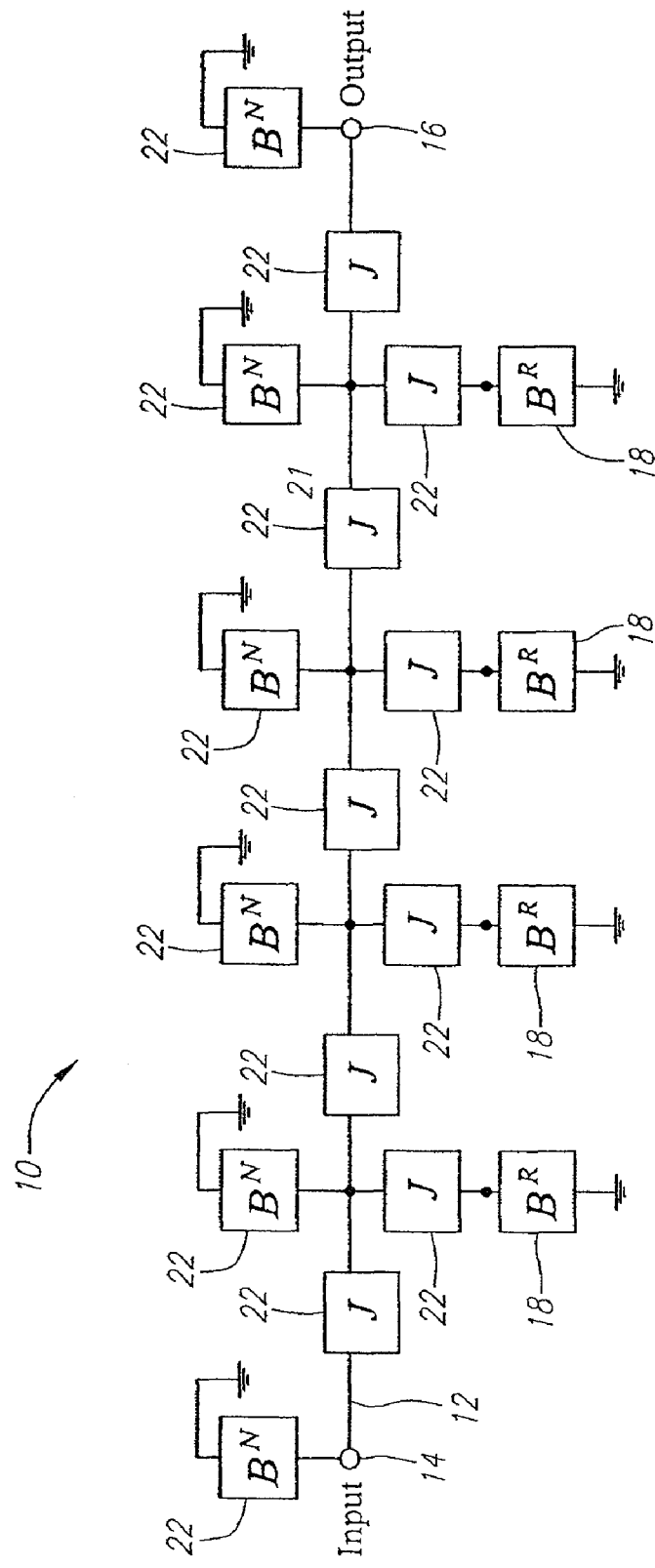
FIGS. 13(a)-13(d) illustrate circuit representations of the tunable RF filter of FIG. 1.
Figure 13B:
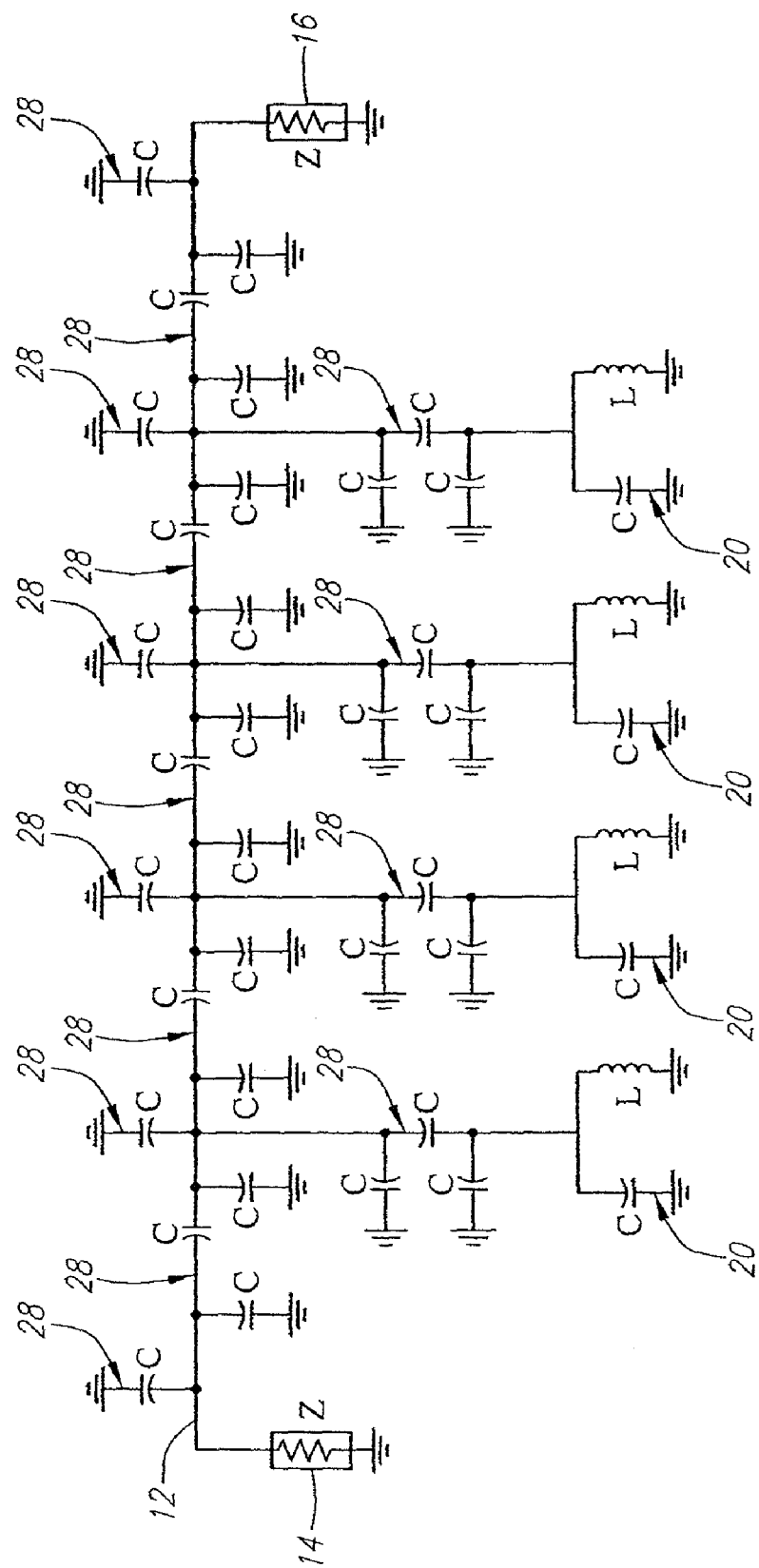
Figure 13C:
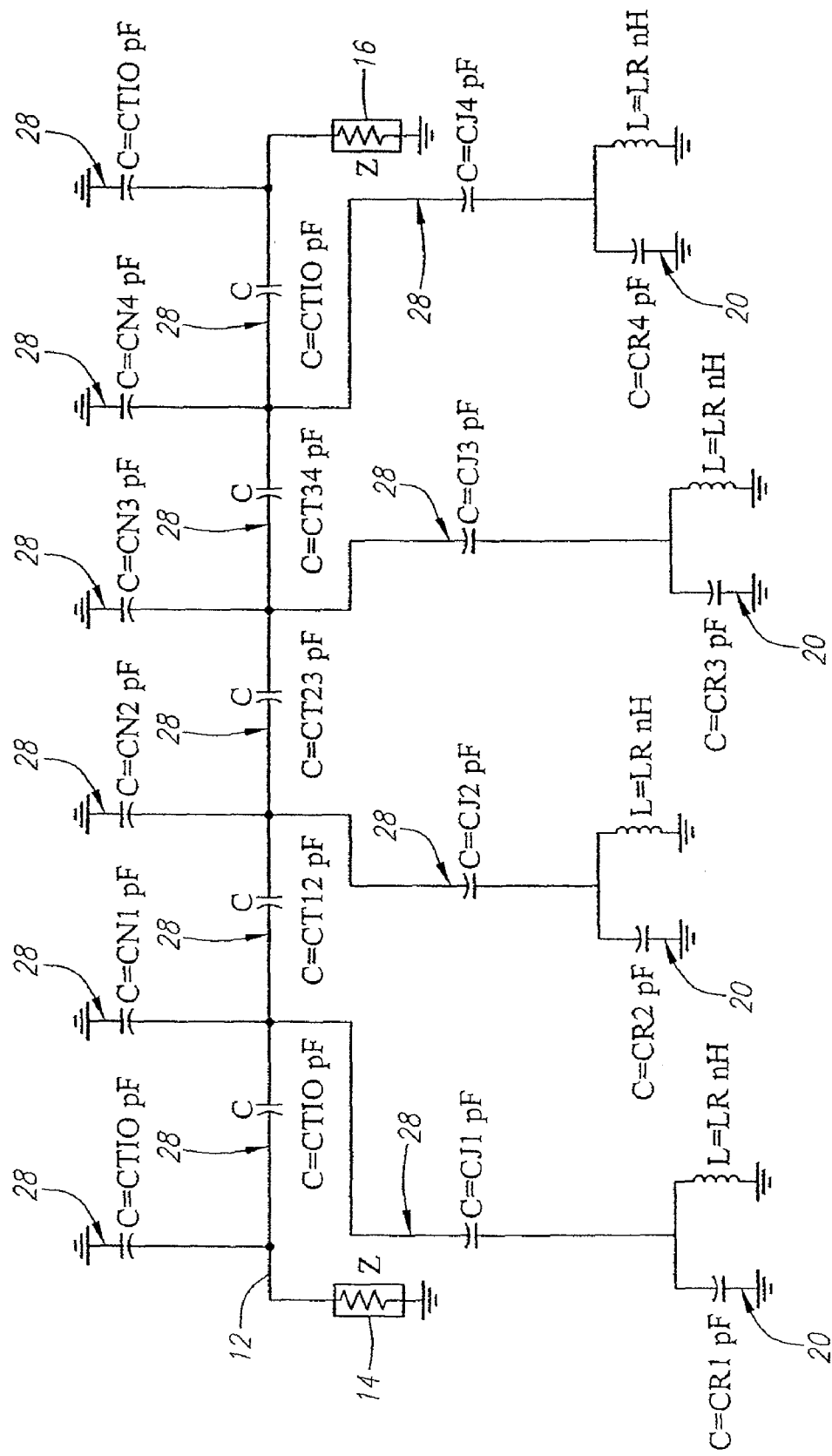

Referring to FIGS. 13(a)-13(c), the non-resonant elements 22 of the filter 10 of FIG. 1 can be replaced with actual components, so that the filter 10 can be modeled and implemented. As shown in FIG. 13(a), the circuit was first reduced to the constituent components necessary to reconfigure the filter 10 using only the non-resonant elements 22. In this case, the tuning elements 20 were not necessary to simulate (model) reconfiguration of the filter 10, and were thus, removed from the circuit representation in FIG. 13(a). As shown in FIG. 13(b), the block components of the circuit representation of FIG. 13(a) have been replaced with actual circuit components. The non-resonant elements 22 represented by $B^N$ were replaced with capacitors, the non-resonant elements 22 represented by J were replaced with capacitive pi networks, and the resonant elements 20 represented by $B^R$ were replaced with parallel capacitor-inductor combinations. The circuit representation of FIG. 13(b) was further reduced to the circuit representation of FIG. 13(c), the non-resonant elements 22 of which can be varied to effect reconfiguration of the filter 10.

Figure 13D:
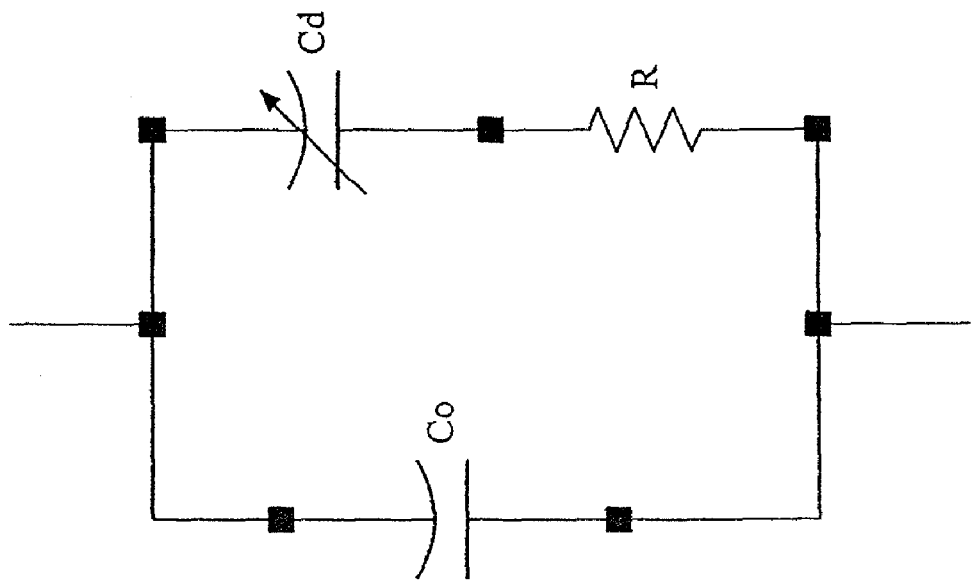
Figure 13D:
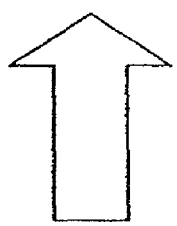
Figure 13D:
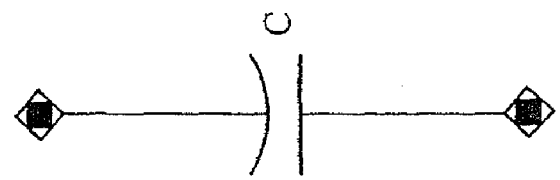

The filter 10 of FIG. 13(c) was emulated using actual circuit component values. The circuit of FIG. 13(c) was modeled in accordance with the polynomial equations discussed above, with the exception that component values relate to the coefficient of the polynomials. As discussed above, the filter 10 has four resonating elements 18, and therefore, four transmission zeroes with three sub-bands formed therebetween, in its frequency response. Thus, the values of the capacitors non-resonant elements 22 in the circuit representation of FIG. 13(c) can be adjusted in accordance with one of the three sets of values illustrated in FIG. 14 to hop a pass band between the three sub-bands to place the filter 10 in a selected one of the three states. Each of the capacitors in the circuit representation of FIG. 13(c) was modeled in accordance with the circuit representation of FIG. 13(d). In particular, each capacitor C was represented as a circuit having a fixed capacitor $C_0$ in parallel with a variable capacitor $C_d$, and a resistor R (representing a switch) in series with the variable capacitor $C_d$.

Figure 15A:
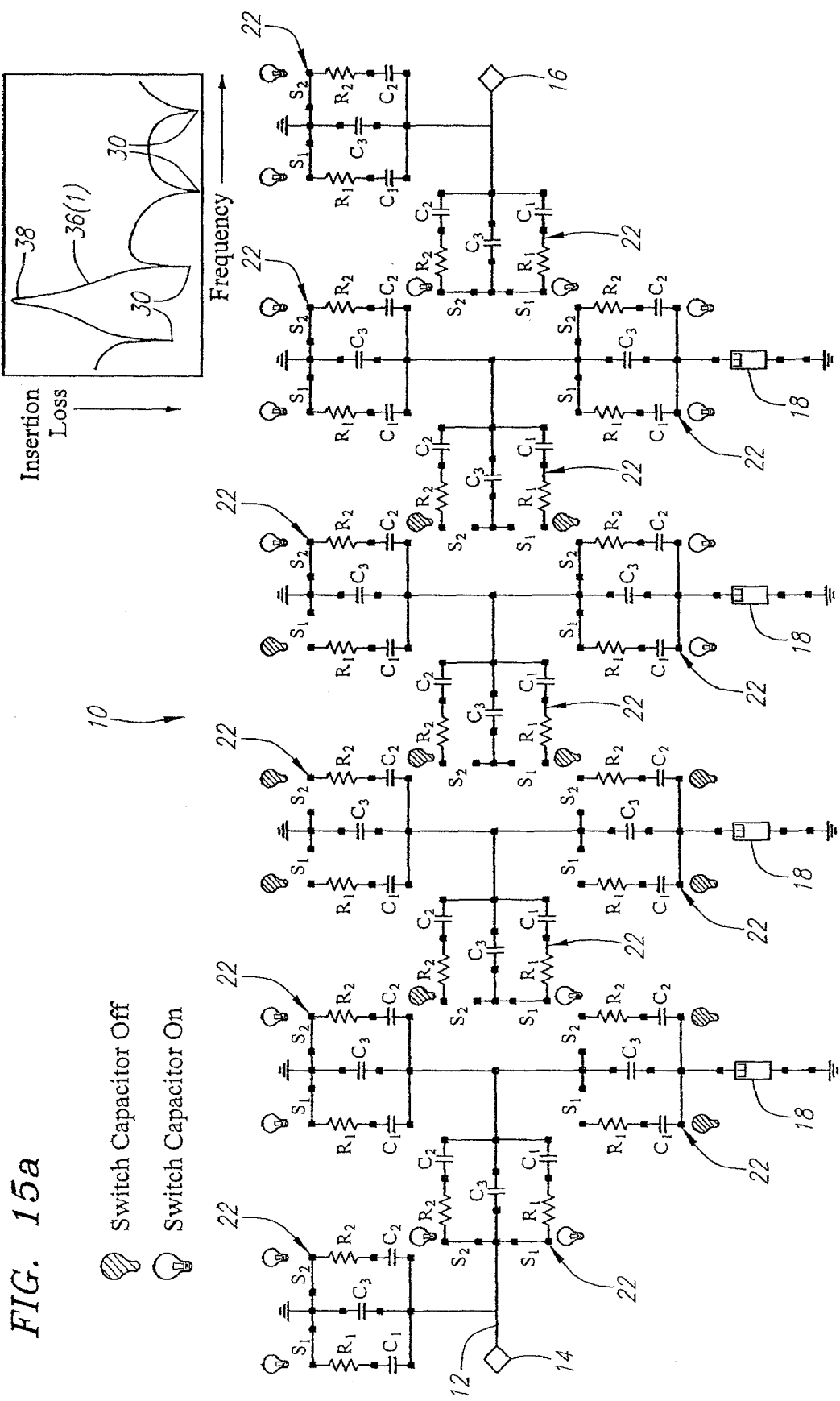
FIGS. 15(a)-15(c) is a circuit implementation of the tunable RF filter of FIG. 1, particularly illustrating various filter states and corresponding frequency responses.
Figure 15B:
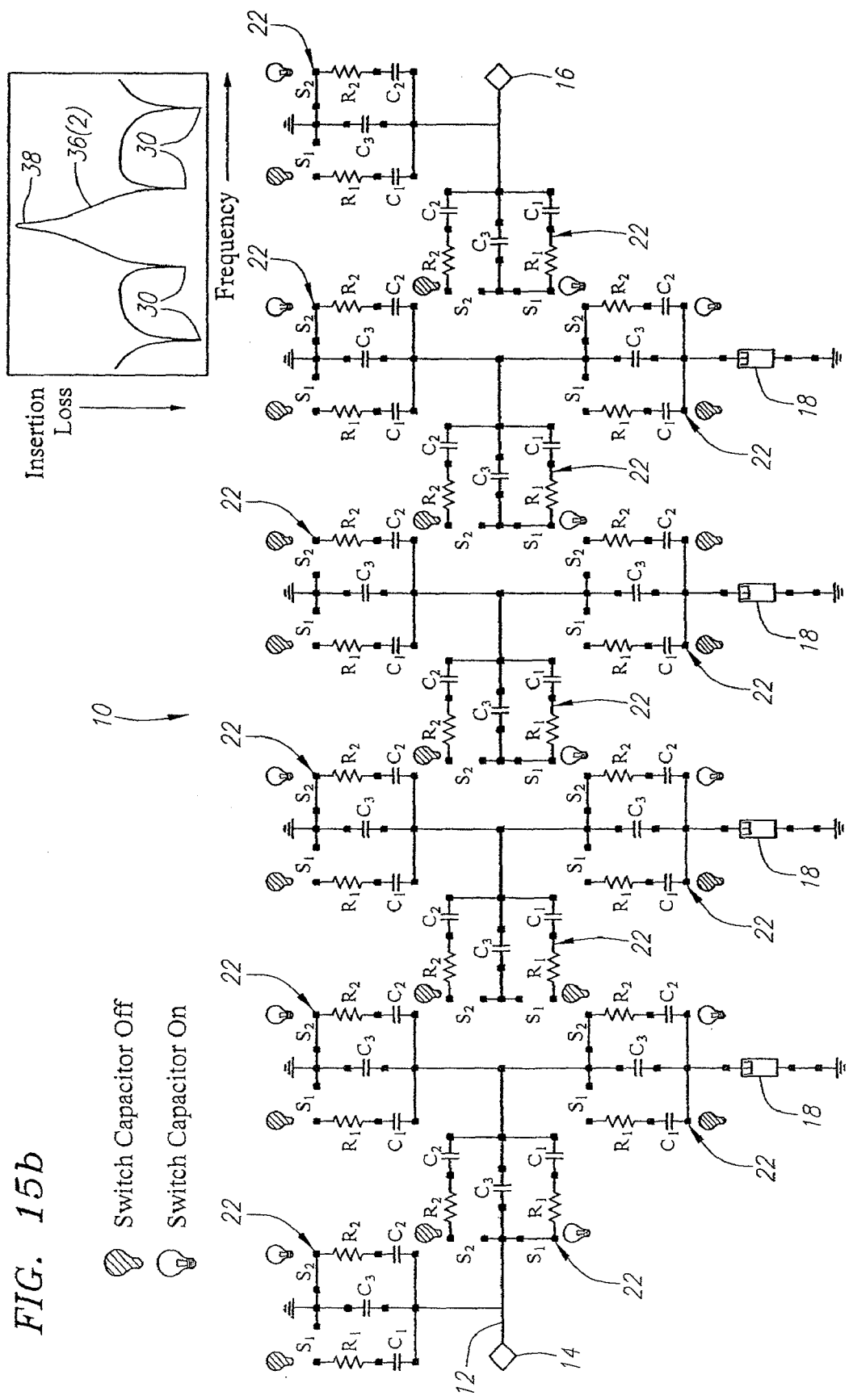
Figure 15C:
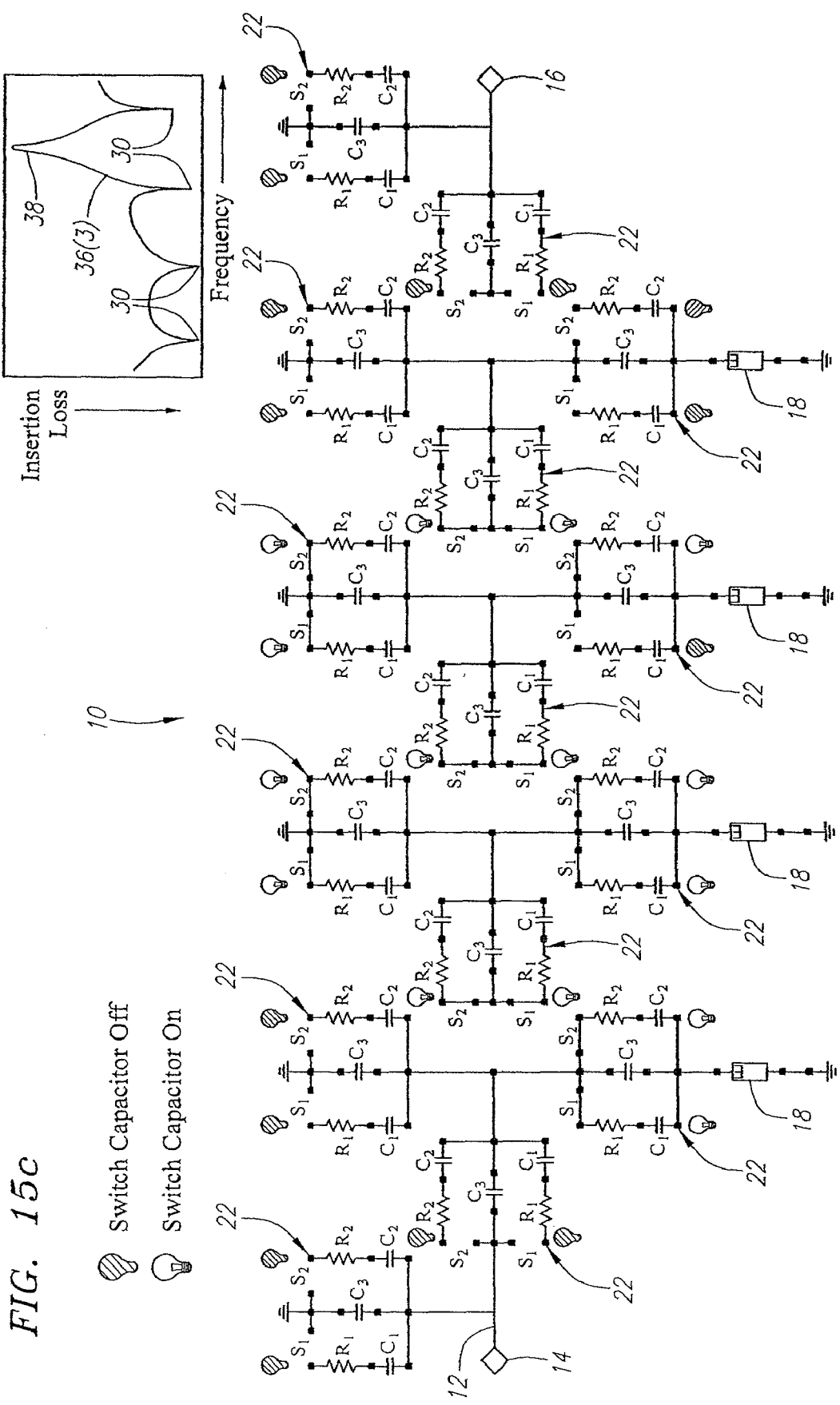

Referring now to FIGS. 15(a)-15(c), the filter 10, using the basic architecture illustrated in FIG. 13(c), can be reconfigured between one of three states by adjusting selected ones of the non-resonant elements 22. As shown, all of the frequency responses of the filter 10 have four transmission zeroes 30 corresponding to the frequencies of the four resonant elements 18, and three sub-bands 36 formed between the transmission zeroes 30. Thus, a pass band 38 can be created in each of the three sub-bands 36 to enable a total of three different states: a left state where the pass band 38 is created in the first sub-band 36(1); a middle state where the pass band 38 is created in the second sub-band 36(2); and a right state where the pass band 38 is created in the third sub-band 36(3).

As shown, each non-resonant element 22 has three capacitors $C_1$-$C_3$ in parallel, with the outer two capacitors $C_1$ and $C_2$ having respective switched capacitances in series with resistors $R_1$ and $R_2$ stimulating resistive loss of the switches $S_1$ and $S_2$. Thus, the capacitors $C_1$ and $C_2$ may be included within the circuit by closing the switches $S_2$ and $S_3$, and excluded from the circuit by independently opening the switches $S_1$ and $S_2$. Thus, assuming that capacitors $C_1$-$C_3$ have equal values, each non-resonant element 22 can have a selected one of the three values: $C_1$ (neither switch $S_1$, $S_2$ closed), $C_2$+$C_3$ (one of the switches $S_1$, $S_2$ closed), or $C_1$+$C_2$+$C_3$ (both switches $S_1$, $S_2$ closed). The switches $S_1$ and $S_2$ can be any suitable loss-switch, such as, e.g., a low-loss GaAs switch. Alternatively, other variable elements capable of adjusting a capacitance value, such as a variable capacitor, GaAs varactor, or switch capacitor, can be used.

It has been determined that the pass band 38 can be placed in the first sub-band 36(1) (left state) when the non-resonant elements 22 have the values dictated by the switch states illustrated in FIG. 15(*a*); in the second sub-band 36(2) (middle state) when the non-resonant elements 22 have the values dictated by the switch states illustrated in FIG. 15(*b*); and in the third sub-band 36(3) (middle state) when the non-resonant elements 22 have the values dictated by the switch states illustrated in FIG. 15(*c*). The filter 10 can be tuned using the parameter extraction and analysis techniques disclosed in U.S. patent application Ser. No. 11/289,463, entitled "Systems and Methods for Tuning Filters," which is expressly incorporated herein by reference. For purposes of illustration, light bulbs adjacent switches in closed states have been shown lit (colored in), and light bulbs adjacent switches in open states have been shown unlit (not colored in). While the filter 10 has been described with respect to FIGS. 15(*a*)-15(*c*) as only having the capability of hopping the pass band 38 between sub-bands 36, the resolution of the circuit can be increased by adding more switched capacitors in order to enable movement of the pass band 38 within a selected sub-band 36. Also, because the pass band 38 is positioned in the centers of the sub-bands 36, no tuning elements are shown coupled to the resonant elements 18.

Figure 16A:
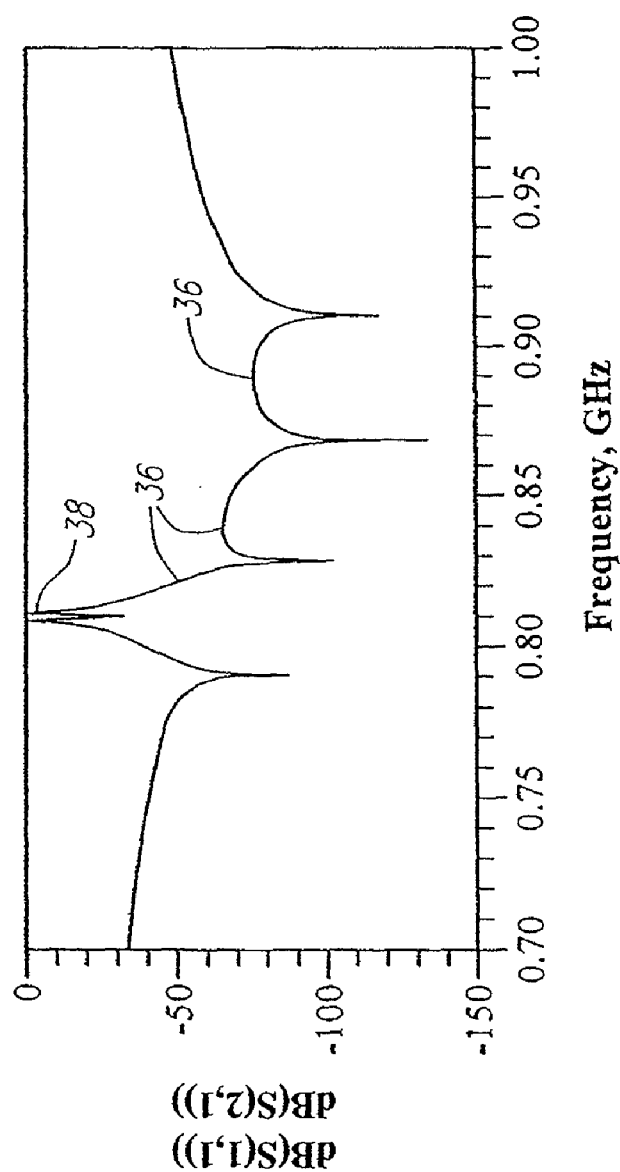
FIGS. 16(a)-16(c) are plots of the frequency response of the RF filter of FIG. 14 in the three states.
Figure 16B:
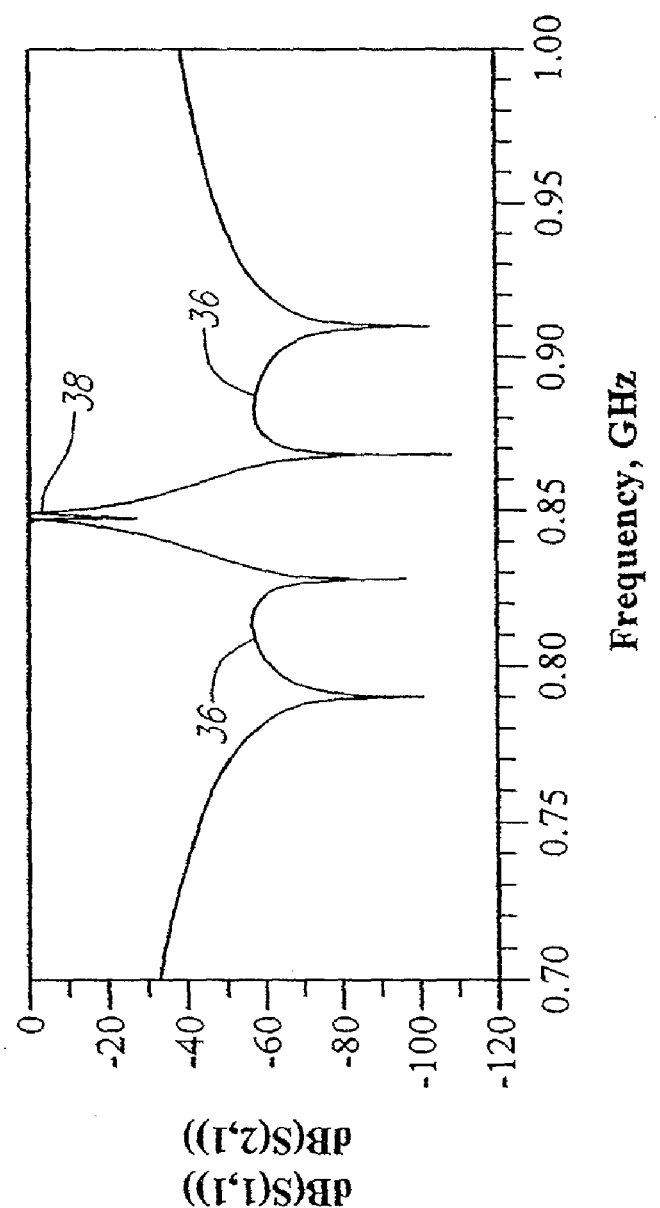
Figure 16C:
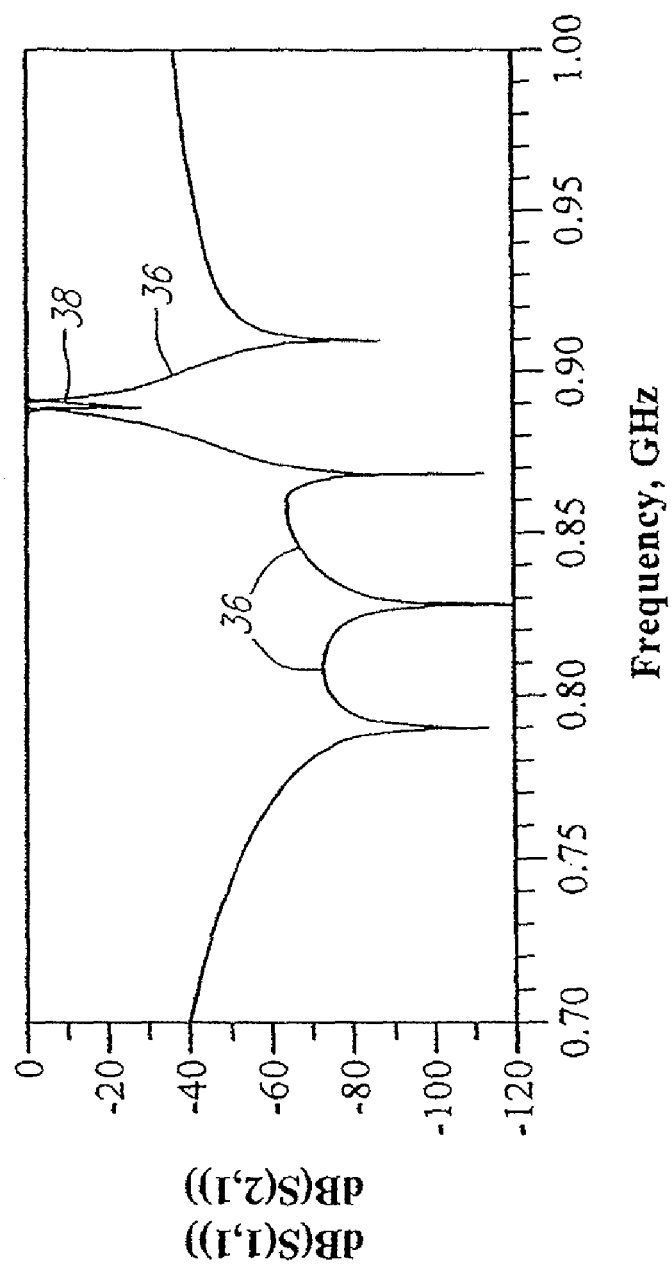
Figure 17:
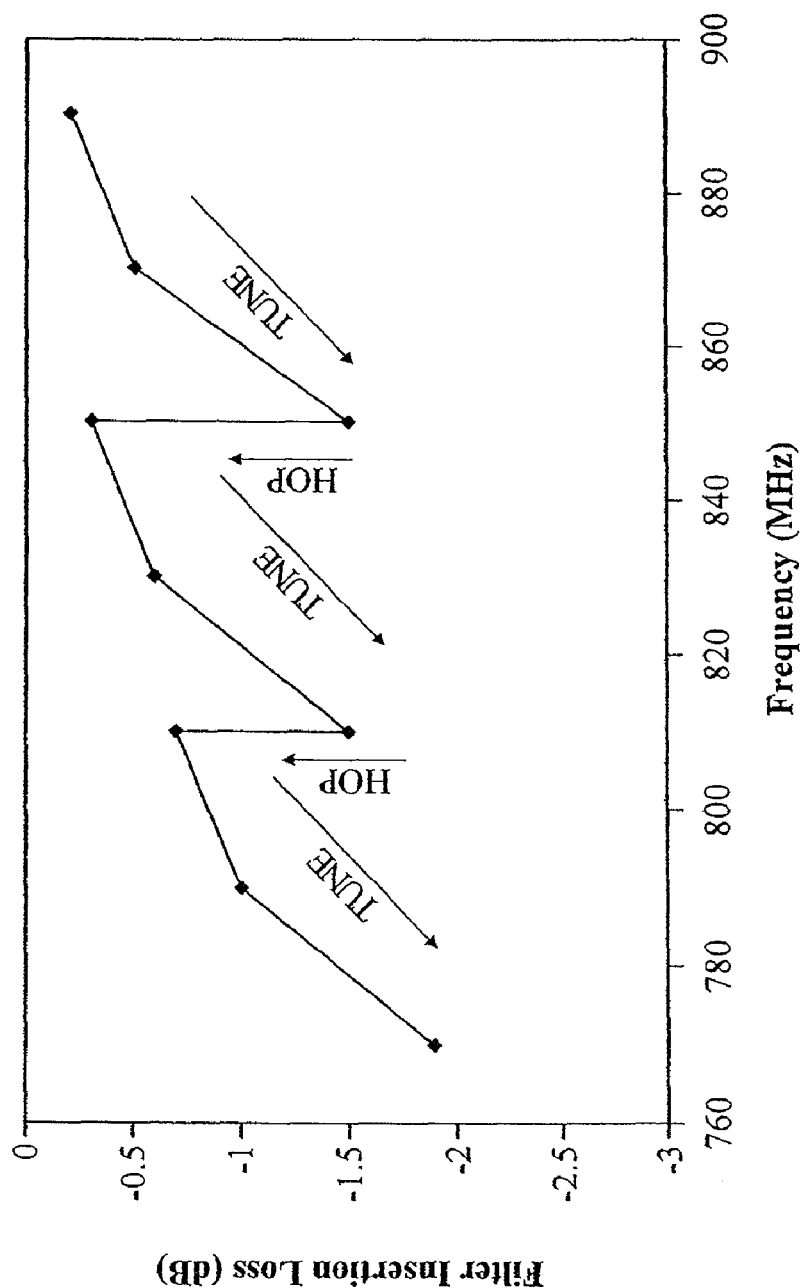
FIG. 17 is a plot illustrating the tuning of the RF filter of FIG. 14 versus insertion loss of the filter.

Referring now to FIG. 17, the emulated filter 10 illustrated in FIG. 13(*c*) is shown being tuned along the frequency range of 770 MHz to 890 MHz to minimize insertion loss. In this scenario, the filter 10 was tuned by adjusting the non-resonant elements 22 to hop the pass band 38 between the centers of the sub-bands 36 (as illustrated in FIGS. 16(*a*)-16(*c*)), and varying the frequencies of the resonant elements 18 to move the pass band 38 within the sub-bands 36 (i.e., to cover the frequency range between the centers of the sub-bands 36). As shown, the pass band 38 is moved from the center of the third sub-band 36(3) (shown in FIG. 15(*c*)) at 890 MHz to the left side of the third sub-band 36(3) at 850 MHz, increasing the insertion loss of the filter 10 from approximately −0.2 dB to approximately −1.5 dB. Once it reaches 850 MHz, the pass band 38 hops from the third sub-band 36(3) to the center of the second sub-band 36(2) (shown in FIG. 15(*b*)), thereby decreasing the insertion loss from approximately −1.5 dB to approximately −0.25 dB. The pass band 38 is then moved from the center of the second sub-band 36(2) at 850 MHz to the left side of the second sub-band 36(2) at 810 MHz, increasing the insertion loss of the filter 10 from approximately −0.25 to approximately −1.5 dB. Once it reaches 810 MHz, the pass band 38 hops from the second sub-band 36(2) to the center of the first sub-band 36(1) (shown in FIG. 15(*a*)), decreasing the insertion loss from approximately −1.5 dB to −0.7 dB. The pass band 38 is then moved from the center of the first sub-band 36(1) at 810 MHz to the left side of the first sub-band 36(1) at 770 MHz, increasing the insertion loss of the filter 10 from approximately −0.7 dB to −1.9 dB. Thus, it can be appreciate that the full range of the frequency range 770 MHz to 890 MHz can be covered by the filter 10 by moving the pass band 38 along the frequency range, while hopping between sub-bands 36 to minimize insertion loss.

Figure 18:
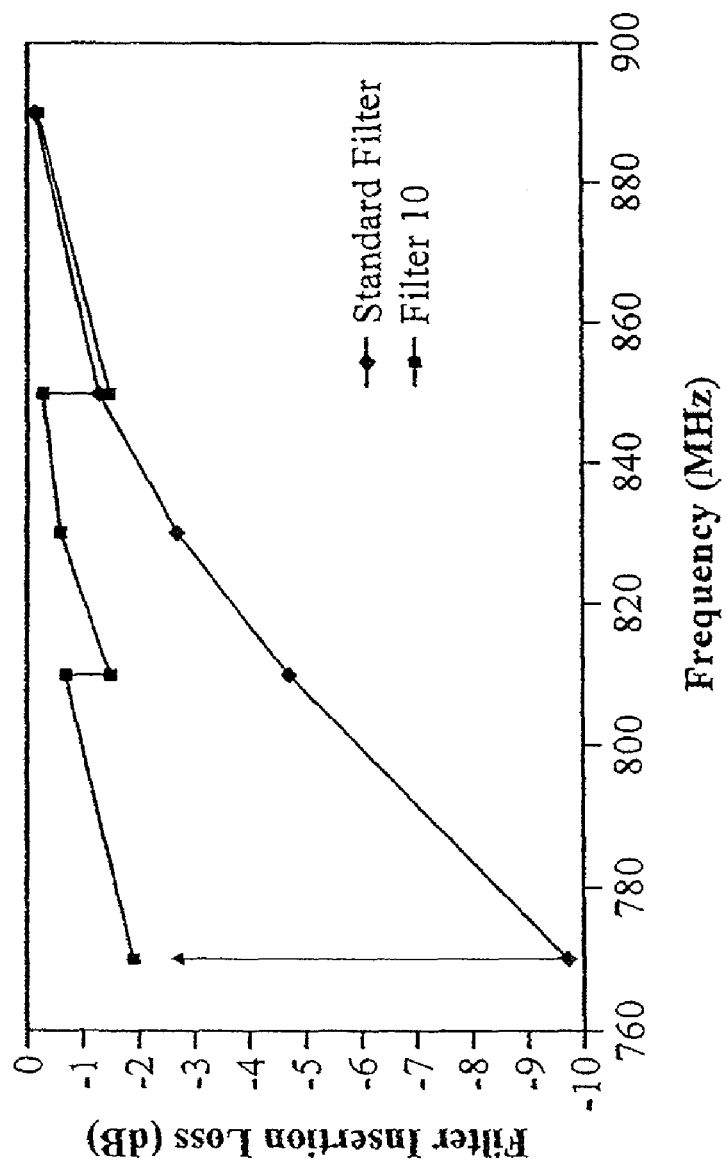
FIG. 18 is a plot comparing the insertion loss of the RF filter of FIG. 14 versus the insertion loss of a conventional filter when tuned over the same frequency range.

Using the modeled parameters illustrated in FIG. 15, it has been demonstrated that the insertion loss is significantly decreased across a frequency range when using non-resonant elements 22, as opposed to only resonant elements 18, to tune a filter. For example, as shown in FIG. 18, the worst case insertion loss of the filter 10 when the non-resonant elements 22 are adjusted, along with the frequencies of the resonant elements 18, to tune the filter 10 over the frequency range 770 MHz to 890 MHz is approximately 8 dB less than the insertion loss of the filter 10 when only the frequencies of the resonant elements are adjusted to tune the filter 10 over the same frequency range.

Figure 19:
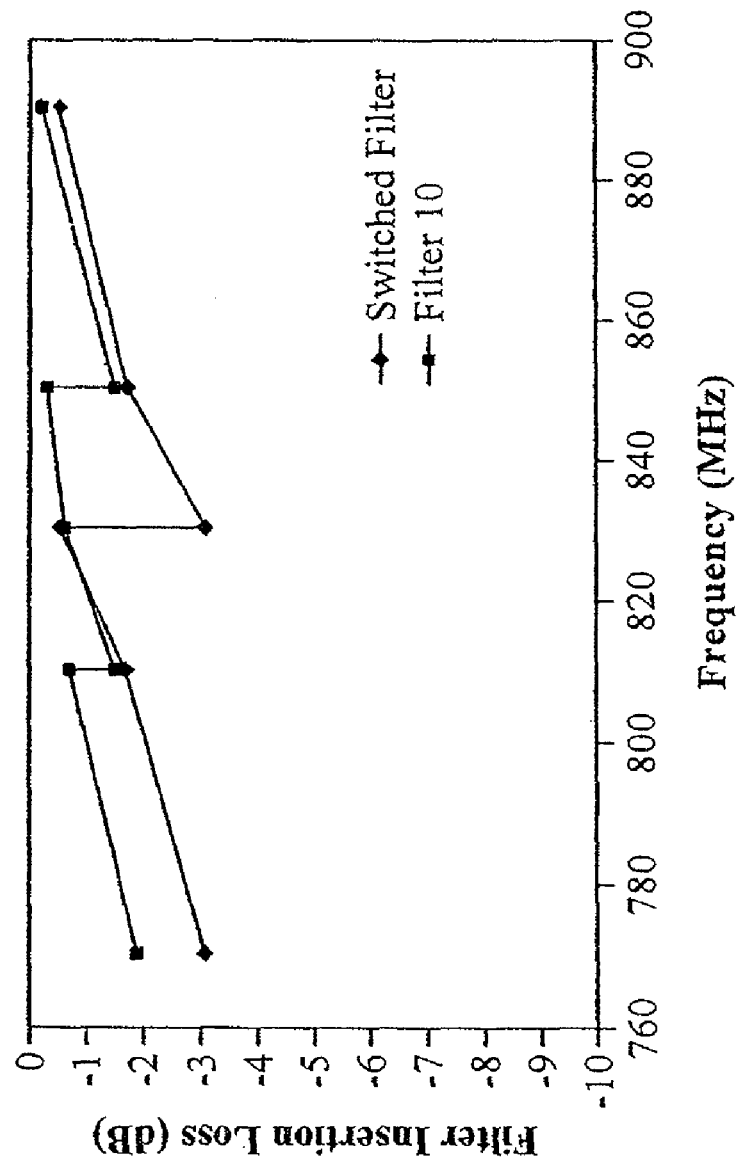
FIG. 19 is a plot comparing the insertion loss of the filter of FIG. 1 versus the insertion loss of a switched filter when tuned over the same frequency range.

It has also been demonstrated that the filter 10, as modeled in accordance with the parameters illustrated in FIG. 15, has an insertion loss that is significantly less than prior art switched filtered tuning techniques. For example, as shown in FIG. 19, the worst case insertion loss of the filter 10 when the variable non-resonant elements are adjusted, along with the frequencies of the resonant elements, to tune the filter 10 over the frequency range 770 MHz to 890 MHz is significantly less than the insertion loss of a switched filter tuned over the same frequency range (assuming small insertion loss from the addition of a switch and adjusting the frequencies of the resonant elements to cover half of the total tuning range between switching).

Figure 20:
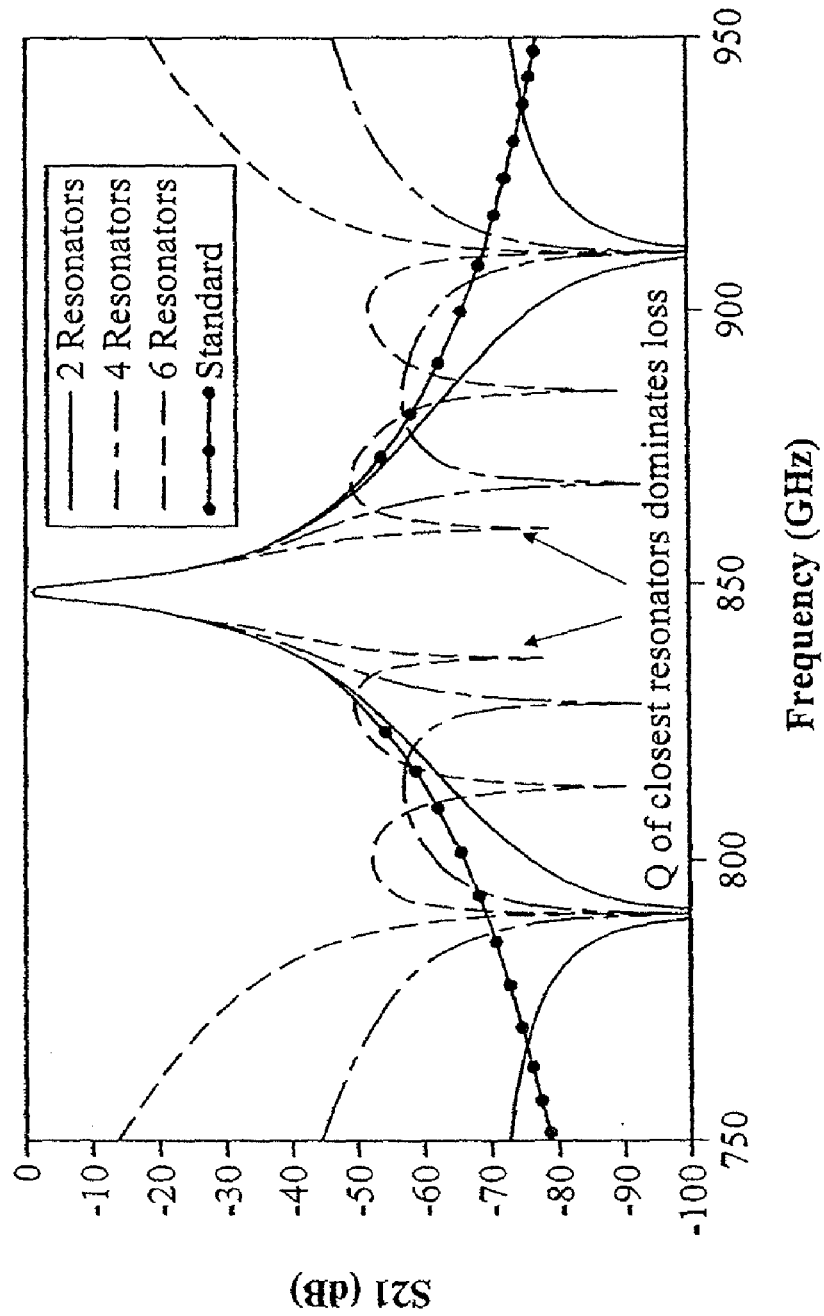
FIG. 20 is a plot comparing frequency responses between two-resonator, four-resonator, and six-resonator tunable filters constructed in accordance with the present inventions and a frequency response of a standard band-pass filter.

Notably, while it has been the conventional thinking that the insertion loss of pass-band filter increases with an increase in the number of resonant elements, it has been demonstrated that the insertion loss does not increase with the number of resonant elements used in a filter utilizing the design techniques described herein. For example, as illustrated in FIG. 20, the frequency response of 2-resonator, 4-resonator and 6-resonator filter designs using the techniques described herein, and a standard filter design, are plotted along the frequency range from 750 GHz to 950 GHz. As there shown, the Q of the closest resonant elements—not the number of resonant elements—dominates the insertion loss.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. A radio frequency (RF) filter, comprising:
   a signal transmission path having an input and an output;
   a plurality of resonant elements disposed along the signal transmission path between the input and the output; and
   a plurality of non-resonant elements coupling the resonant elements together to form a stop band having a plurality of transmission zeroes corresponding to respective frequencies of the resonant elements, and at least one sub-band between the transmission zeroes, wherein the non-resonant elements comprise at least one variable non-resonant element for selectively introducing at least one reflection zero within the stop band to create a pass band in one of the at least one sub-bands.

2. The RF filter of claim 1, wherein the at least one sub-band comprises a plurality of sub-bands.

3. The RF filter of claim 2, wherein the at least one variable non-resonant element is for displacing the at least one reflection zero along the stop band to create the pass band within selected ones of the sub-bands.

4. The RF filter of claim 3, wherein the pass band has substantially different bandwidths within the selected sub-bands.

5. The RF filter of claim 2, wherein the at least one variable non-resonant element is for displacing at least another reflection zero within the stop band to create another pass band within another one of the sub-bands.

6. The RF filter of claim 1, wherein the at least one variable non-resonant element is for displacing the at least one reflection zero along the stop band to selectively move the pass band within the one sub-band.

7. The RF filter of claim 1, wherein the at least one reflection zero comprises a plurality of reflection zeroes.

8. The RF filter of claim 1, wherein the at least one variable non-resonant element comprises a plurality of variable non-resonant elements.

9. The RF filter of claim 1, further comprising at least one tuning element configured for modifying the frequency of at least one of the resonant elements.

10. The RF filter of claim 9, wherein the at least one tuning element is configured for modifying the frequency of the at least one resonant element to displace the transmission zero corresponding to each frequency of the at least one resonant element along the stop band relative to the at least one reflection zero.

11. The RF filter of claim 9, wherein the at least one tuning element comprises a plurality of tuning elements configured for modifying the frequencies of the resonant elements to simultaneously displace the stop band with the pass band along a frequency range.

12. The RF filter of claim 1, wherein the at least one variable non-resonant element has an adjustable susceptance.

13. The RF filter of claim 1, wherein the at least one variable non-resonant element comprises at least one of a variable capacitor, a loss-loss switch, a varactor, and a switched capacitor.

14. The RF filter of claim 1, wherein each of the resonant elements comprises a thin-film lumped element structure.

15. The RF filter of claim 14, wherein the thin-film lumped element structure comprises a high temperature superconductor (HTS).

16. The RF filter of claim 1, further comprising a controller configured for generating electrical signals to adjust the at least one variable non-resonant element.

17. A radio frequency (RF) filter, comprising:
a signal transmission path having an input and an output;
a plurality of resonant elements disposed along the signal transmission path between the input and the output; and
a plurality of non-resonant elements coupling the resonant elements together to form a stop band having a plurality of transmission zeroes corresponding to respective frequencies of the resonant elements, and a plurality of sub-bands between the transmission zeroes; and
an electrical controller configured for varying at least one of the non-resonant elements to introduce at least one reflection zero along the stop band to create a pass band within selected ones of the sub-bands.

18. The RF filter of claim 17, wherein the pass band has substantially different bandwidths within the selected sub-bands.

19. The RF filter of claim 17, wherein the electrical controller is configured for varying the at least one non-resonant element to displace the at least one reflection zero along the stop band to create another pass band within another one of the sub-bands.

20. The RF filter of claim 17, wherein the electrical controller is configured for varying the at least one non-resonant element to displace the at least one reflection zero along the stop band to selectively move the pass band within each of the selected sub-bands.

21. The RF filter of claim 17, wherein the at least one reflection zero comprises a plurality of reflection zeroes.

22. The RF filter of claim 17, wherein the at least one non-resonant element comprises at least two non-resonant element.

23. The RF filter of claim 17, further comprising a plurality of tuning elements configured for modifying the frequencies of the resonant elements to independently displace the respective transmission zeroes relative to the at least one reflection zero.

24. The RF filter of claim 17, wherein the electrical controller is configured for adjusting a susceptance of the at least one non-resonant element.

25. The RF filter of claim 17, wherein the at least one non-resonant element comprises at least one of a variable capacitor, loss-loss switch, a varactor, and a switched capacitor.

26. The RF filter of claim 17, wherein each of the resonant elements comprises a thin-film lumped element structure.

27. The RF filter of claim 17, further comprising a controller configured for generating electrical signals to adjust the at least one variable non-resonant element.

28. The RF filter of claim 17, wherein the thin-film lumped element structure comprises a high temperature superconductor (HTS).

29. A radio frequency (RF) filter, comprising:
a signal transmission path having an input and an output;
a plurality of resonant elements disposed along the signal transmission path between the input and the output; and
a plurality of non-resonant elements coupling the resonant elements together to form a stop band having a plurality of transmission zeroes corresponding to respective frequencies of the resonant elements, and at least one sub-band between the transmission zeroes, wherein the non-resonant elements have susceptance values that locate at least one reflection zero within the stop band to create a pass band in one of the at least one sub-bands.

30. The RF filter of claim 29, wherein the at least one sub-band comprises a plurality of sub-bands.

31. The RF filter of claim 29, wherein the at least one reflection zero comprises a plurality of reflection zeroes.

32. The RF filter of claim 29, wherein each of the resonant elements comprises a thin-film lumped element structure.

33. The RF filter of claim 32, wherein the thin-film lumped element structure comprises a high temperature superconductor (HTS).

34. A radio frequency (RF) filter, comprising:
a signal transmission path having an input and an output;
a plurality of nodes disposed along the signal transmission path;
a plurality of resonant branches respectively extending from the nodes;
a plurality of non-resonant branches respectively extending from the nodes;
a plurality of resonant elements respectively coupled to the resonant branches;
a plurality of non-resonant elements, some of which are respectively coupled to the non-resonant branches;
a plurality of transmission zeroes corresponding to resonant frequencies of the resonant elements; and
at least one reflection zero formed between the transmission zeroes to create a pass band.

35. The RF filter of claim 34, wherein the non-resonant elements comprise at least one variable non-resonant element for selectively displacing the at least one reflection zero relative to the transmission zeroes.

36. The RF filter of claim 34, wherein plurality of transmission zeroes comprises more than two transmission zeroes.

37. The RF filter of claim 34, wherein the at least one reflection zero comprises a plurality of reflection zeroes.

38. The RF filter of claim 34, wherein each of the resonant elements comprises a thin-film lumped element structure.

39. The RF filter of claim 38, wherein the thin-film lumped element structure comprises a high temperature superconductor (HTS).

40. A method of tuning a radio frequency (RF) filter having a stop band that defines a tuning range, the method comprising:

modifying the RF filter from a first frequency configuration to a second frequency configuration, wherein the RF filter, when in the first frequency configuration, has a first set of pass band characteristics within the tuning range defined by the stop band, and wherein the RF filter, when in the second frequency configuration, has a second different set of pass band characteristics within the tuning range of the stop band.

41. The method of claim 40, wherein the first and second pass band characteristics have different center frequencies.

42. The method of claim 40, wherein the first and second pass band characteristics have different bandwidths.

43. The method of claim 40, wherein the first and second pass band characteristics have different numbers of non-contiguous pass bands.

44. The method of claim 40, wherein the RF filter is modified from the first frequency configuration to the second frequency configuration by displacing at least one reflection zero within the stop band.

45. The method of claim 44, wherein the stop band has a plurality of transmission zeroes, and wherein the at least one reference zero is displaced in frequency more than the transmission zeroes are displaced in frequency.

46. The method of claim 40, wherein the insertion loss of the RF filter is minimized when modifying the RF filter from the first frequency configuration to the second frequency configuration.

* * * * *